United States Patent
Dubose et al.

(10) Patent No.: US 12,224,164 B2
(45) Date of Patent: Feb. 11, 2025

(54) RADIO FREQUENCY (RF) SYSTEM WITH EMBEDDED RF SIGNAL PICKUPS

(71) Applicant: Tokyo Electron Limited, Tokyo (JP)

(72) Inventors: Chelsea Dubose, Austin, TX (US);
Barton Lane, Austin, TX (US);
Merritt Funk, Austin, TX (US); Justin Moses, Austin, TX (US); Yohei Yamazawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 372 days.

(21) Appl. No.: 17/514,815

(22) Filed: Oct. 29, 2021

(65) Prior Publication Data

US 2023/0132660 A1    May 4, 2023

(51) Int. Cl.
*H01J 37/32*    (2006.01)

(52) U.S. Cl.
CPC ...... *H01J 37/32935* (2013.01); *H01J 37/321* (2013.01); *H01J 37/32174* (2013.01); *H01J 37/3211* (2013.01)

(58) Field of Classification Search
CPC ............. H01J 37/32091; H01J 37/3211; H01J 37/32137; H01J 37/32174; H01J 37/32183; H01J 37/32577; H01J 37/32917; H01J 37/32935; H01J 37/3299; H01J 37/321
See application file for complete search history.

(56) References Cited

U.S. PATENT DOCUMENTS

| | | | | |
|---|---|---|---|---|
| 5,273,610 A | * | 12/1993 | Thomas, III | H01J 37/32935 324/96 |
| 5,633,648 A | * | 5/1997 | Fischer | H01Q 7/08 343/788 |
| 6,333,634 B1 | * | 12/2001 | Haze | H01J 37/32082 315/111.21 |
| 7,154,256 B2 | * | 12/2006 | Parsons | G01R 27/2647 324/72 |
| 7,538,562 B2 | * | 5/2009 | Garvin | H01J 37/32082 324/687 |
| 7,714,594 B2 | * | 5/2010 | Ibuki | G01R 15/142 324/686 |
| 8,040,141 B2 | | 10/2011 | Heckleman et al. | |
| 9,291,649 B2 | | 3/2016 | Brown et al. | |
| 11,600,474 B2 | * | 3/2023 | Lane | H01J 37/241 |
| 2004/0060660 A1 | * | 4/2004 | Klimecky | H01J 37/321 156/345.44 |
| 2016/0091534 A1 | * | 3/2016 | Emma | H01J 37/32935 118/712 |

* cited by examiner

*Primary Examiner* — Kurt Sweely
(74) *Attorney, Agent, or Firm* — Slater Matsil, LLP

(57) ABSTRACT

A radio frequency (RF) system including: a first conductive covering surface, a portion of the first conductive covering surface including a portion of the first outer wall of a first RF device; a second conductive covering surface aligned to the first conductive covering surface, the second conductive covering surface being disposed around the insulating hole; an insulating hole for an RF center conductor extending through the first conductive covering surface and the second conductive covering surface, the first conductive covering surface and the second conductive covering surface being disposed around the insulating hole; a cavity bounded by the first conductive covering surface and the second conductive covering surface, the cavity being an insulating region; and an RF signal pickup disposed within the cavity.

22 Claims, 11 Drawing Sheets

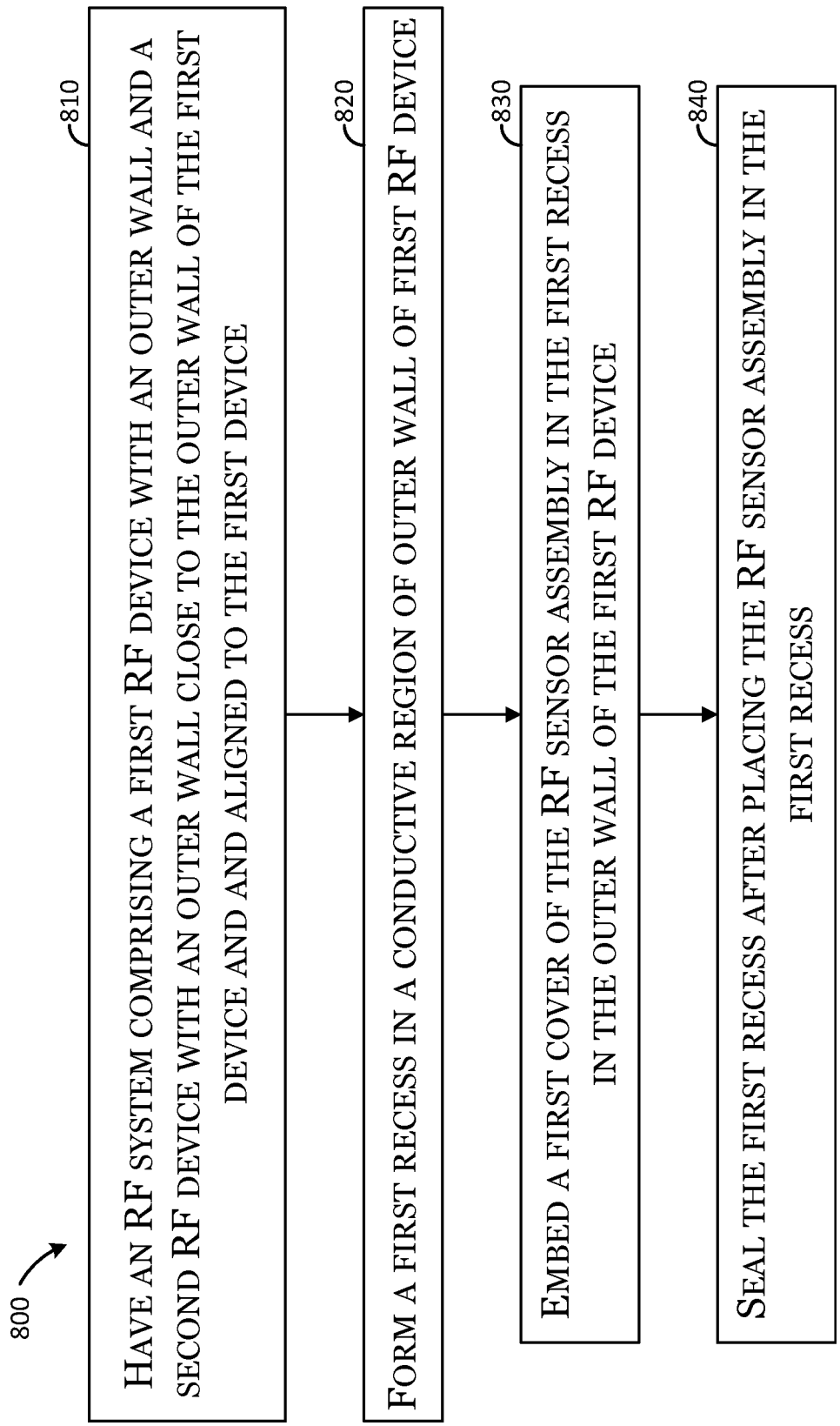

RADIO FREQUENCY (RF) SYSTEM WITH EMBEDDED RF SIGNAL PICKUPS

CROSS-REFERENCE TO RELATED APPLICATIONS

This application is related to co-pending U.S. Non-Provisional application Ser. No. 16/913,526 filed on Jun. 26, 2020 and U.S. Non-Provisional application Ser. No. 16/913,548 filed on Jun. 26, 2020, and U.S. Non-Provisional application Ser. No. 16/913,545 filed on Jun. 26, 2020, which applications are hereby incorporated herein by reference.

TECHNICAL FIELD

The present invention relates generally to radio frequency (RF) systems, and, in particular embodiments, to an RF system with an RF signal pickup embedded in RF devices.

BACKGROUND

Generally, an integrated circuit (IC) is fabricated by sequentially depositing and patterning layers of dielectrics, metals, and semiconductors over a substrate to form a network of electronic components connected by metal lines and vias, all integrated into one monolithic structure. Plasma processes are used in deposition and patterning techniques such as atomic layer etch and deposition (ALE and ALD), high aspect ratio contact (HARC) etch, and selective deposition. At each technology node, the component density is roughly doubled by shrinking feature sizes using innovations such as extreme ultraviolet (EUV) lithography and three-dimensional (3D) devices such as the gate-all-around field-effect transistor (GAAFET) and 3D NAND memory. Fabricating 3D structures with nanoscale feature sizes controlled at the atomic scale challenges plasma processing to provide stringent precision and control over a wide range of metrics: linewidth, sidewall profile, line edge roughness (LER), anisotropy, film thickness, conformality, area selectivity and aspect-ratio selectivity. Plasma process control systems include a controller which may adjust the RF signals used to ignite and sustain plasma to control plasma properties that are influenced by the RF characteristics such as, electron density, ion energy and ion angle distributions, and radical-to-ion flux ratio. High precision RF voltage and current (V-I) sensors provide feedback to the controller to dynamically adjust the RF signals. Further innovations are needed that enhance the measurement accuracy to provide a more precise control of RF signals in plasma systems.

SUMMARY

A radio frequency (RF) system including: a first RF device having a first outer wall; a first conductive covering surface, a portion of the first conductive covering surface including a portion of the first outer wall; a second RF device having a second outer wall, the first RF device being electrically coupled to the second RF device; a second conductive covering surface, a portion of the second conductive covering surface including a portion of the second outer wall; an insulating hole for an RF center conductor extending through the first conductive covering surface and the second conductive covering surface; a cavity disposed between the first conductive covering surface and the second conductive covering surface, the cavity being an insulating region; and an RF signal pickup disposed in the cavity.

A radio frequency (RF) system including: a first conductive covering surface, a portion of the first conductive covering surface including a portion of the first outer wall of a first RF device; a second conductive covering surface aligned to the first conductive covering surface, the second conductive covering surface being disposed around the insulating hole; an insulating hole for an RF center conductor extending through the first conductive covering surface and the second conductive covering surface, the first conductive covering surface and the second conductive covering surface being disposed around the insulating hole; a cavity bounded by the first conductive covering surface and the second conductive covering surface, the cavity being an insulating region; and an RF signal pickup disposed within the cavity.

A method of embedding a radio frequency (RF) sensor assembly in an RF system, the method including: having an RF system including: a first RF device having an outer wall; and a second RF device having an outer wall in close proximity to the outer wall of the first RF device, the outer wall of the second RF device being aligned to the first RF device; forming a first recess in a conductive region of the outer wall of the first RF device; embedding a first cover of the RF sensor assembly in the first recess in the outer wall of the first RF device; and covering the first recess after placing the RF sensor assembly in the first recess.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates a block diagram for a method of embedding an RF sensor assembly in an RF system.

DETAILED DESCRIPTION OF ILLUSTRATIVE EMBODIMENTS

Figure 1:
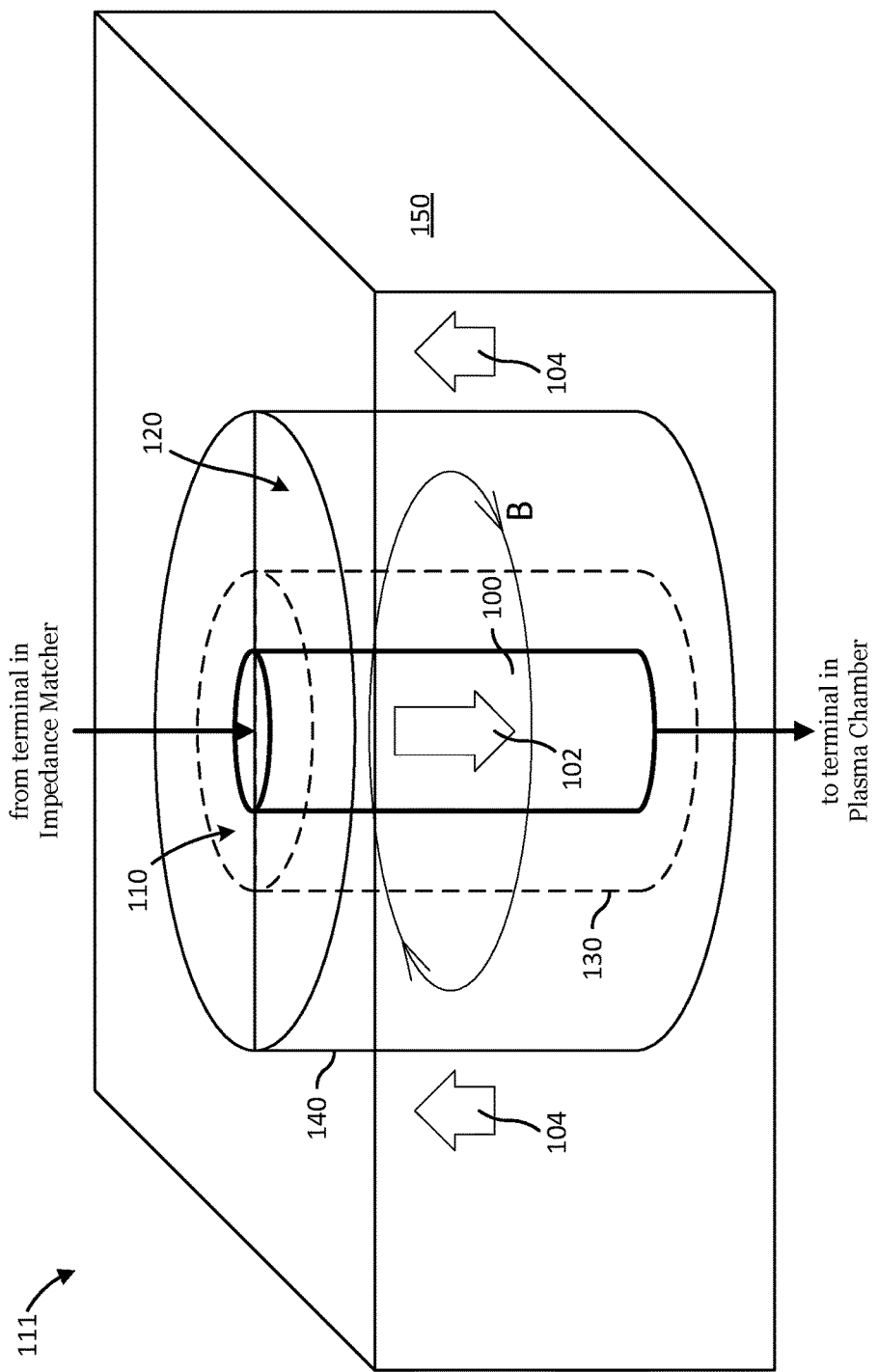
FIG. 1 illustrates a perspective view of an RF coaxial transmission line structure comprising an RF center conductor in an RF sensor assembly, in accordance with some embodiment.

The disclosure describes embodiments of a radio frequency (RF) system having an RF signal pickup disposed in a cavity comprising recesses in the outer walls of RF devices of the RF system. The RF signal being measured propagates along an RF center conductor that is configured to pass through the cavity in which the RF signal pickups are disposed. The RF signal pickup, placed in a location in the cavity, interact with the electromagnetic field around the RF center conductor to generate measurement signals indicative of the RF voltage and current waveforms at that location. The example RF systems described in this disclosure are RF systems of plasma processing systems. In these systems, plasma is ignited and sustained in a plasma chamber using RF signals coupled to RF electrodes of the chamber. In some embodiments, the plasma chamber may be configured as capacitively-coupled plasma (CCP) chamber while, in some other embodiments, the plasma chamber may be configured as inductively coupled plasma (ICP) chamber. The RF devices in which the cavity for an RF signal pickup is embedded may include any RF device of the system carrying an RF signal that is to be measured. The RF devices in the example embodiments described in this disclosure are the plasma chamber and the impedance matcher coupled to an RF electrode of the plasma chamber. However, it is understood that an RF device may be some other device used in generating, transmitting, processing, or receiving an RF signal of the RF system. For example, the RF device may be an RF signal generator, an RF modulator, an RF amplifier, or simply a coaxial flange of an RF transmission line.

The RF sensor assembly has no independent housing, hence is advantageous for use in RF systems where space is at a premium. The components of the sensor assembly such as the RF signal pickup, conductive electric field shields, connectors conducting signals from the RF signal pickup to electrical terminals, and insulating parts supporting the RF signal pickup, may be disposed in the cavity comprising recesses in the walls of RF devices. The cavity wall and the covering surfaces of the cavity with apertures for the RF center conductor are surfaces of a monolithic component of the outer wall of an RF device or be surfaces of separate components attached to a wall of one of the RF devices during assembly. The cavity is an insulating region extending radially from the RF center conductor to the cavity wall and axially from a first conductive covering surface to a second conductive covering surface. All insulators in this region are considered to be part of the cavity. The insulators include solid dielectric materials, such as plastic, resin, and insulating polymers, or a gas such as air.

Plasma properties relevant to plasma processing generally depend on characteristics of the RF signals providing RF power to plasma within the chamber. As known to persons skilled in the art, the RF frequency, the magnitudes of the RF voltage (V) and current (I), and the phase difference between V and I influence plasma properties such as electron density, ion energy distribution, ion angle distribution, and radical-to-ion flux ratio. These plasma properties may affect process characteristics such as sidewall profile, anisotropy, conformality, aspect-ratio selectivity, and radial uniformity of plasma density. So, usually, the RF system includes an RF signal pickup (e.g., a voltage and current (V-I) sensor) to monitor the RF signal close to where it is coupled to an electrode of the plasma chamber. The RF signal pickup may acquire an RF signal waveform using an RF signal pickup, and the waveform processed with electronic circuitry to extract relevant signal characteristics. The extracted information may be used in various ways. For example, the information may provide feedback to a controller to adjust the RF signal to control the plasma process, or used for monitoring and troubleshooting the plasma process.

The RF power delivered by an RF source to an electrical load depends not only on the RF signal strength but also on proper matching between the load impedance and the source impedance. In the RF system of a plasma processing system, the load impedance coupled to the RF power source sustaining the plasma includes an impedance of the plasma, or plasma impedance. Plasma impedance may vary during processing. Occasionally, a rapid change in impedance may increase the risk of an undesirable voltage or current surge, for example, when the plasma is ignited or when the surface changes abruptly as a top layer gets removed by plasma, exposing a different material below the removed layer. One method for suppressing surges and achieving efficient power transfer from the power source to the plasma is to dynamically adjust the load impedance using an adjustable impedance matcher inserted along the RF signal path between the RF source and the plasma chamber. The controller for the plasma process may use the feedback received from the RF signal pickup to control the impedance matcher and the RF source synchronously to maintain a desired RF signal at the respective RF electrode. Typically, the RF signal waveform is detected from the RF conductor that couples the impedance matcher to an RF electrode of the plasma chamber. As known to a person skilled in the art, the signal waveforms are functions of time as well as the position along a signal transmission line carrying the RF signal. If the RF signal waveform is acquired close to the respective RF electrode of the plasma chamber then the detected waveform is a more accurate representation of the RF signal received by the RF electrode. This improves the accuracy of the feedback control provided by the controller. The waveform acquisition is performed by an RF signal pickup placed in an insulating region around an RF center conductor. For higher accuracy, the RF signal pickup may be placed as close as possible to the RF electrode of the plasma chamber.

FIG. 1 illustrates a perspective view of a portion of a coaxial transmission line structure 111 comprising an RF center conductor 100 at a location where the signal waveforms may be acquired from the electromagnetic fields generated by the RF signal propagating between two RF devices along the RF center conductor 100. In some embodiment, the two RF devices are the plasma chamber and the impedance matcher, referred to as the first RF device and the second RF device, respectively. The RF system is configured to transmit RF power from the impedance matcher to the plasma chamber via the RF center conductor 100, as indicated by two arrows near the top and the bottom of the structure 111, illustrated in FIG. 1. An example of an embodiment where a plasma chamber 210 is the first RF device and an impedance matcher 220 is the second RF device is described in further detail below with reference to FIG. 2. A coaxial transmission line structure comprising a first RF center conductor 264 may transmit an RF signal between the two RF devices. A portion of this coaxial transmission line structure comprising the RF center conductor 264 passing through a cavity 266 in a recess in a first outer wall 204 of the plasma chamber 210 corresponds to the portion of a coaxial transmission line structure 111 comprising the RF center conductor 100.

The RF center conductor 100 is positioned along a central axis of the insulating region, referred to as an insulating hole no. An outer surface 130 of the insulating hole no is shaped like the curved surface of a cylinder, indicated by a dashed outline in FIG. 1. Contiguous with the insulating hole no is a cavity 120, which is another insulating region, formed in recesses in conductive portions of outer walls of the two RF devices. In FIG. 1, the cavity 120 is in such a recess formed in a conductive portion of an outer wall 150 of an RF device. As illustrated in FIG. 1, a wall of the recess in the conductive outer wall 150 of the RF device forms a cavity wall 140 of the cavity 120. The conductive cavity wall 140 is a monolithic part of the conductive portion of the outer wall 150 in this embodiment; the outer wall 150, together with the cavity wall 140, function as the outer conductor of the coaxial transmission line structure in that may be configured as a ground shield for the RF center conductor 100.

The insulating hole no comprises openings in two conductive surfaces (not shown) of a cavity 120 and, may extend further to allow the RF center conductor 100 to pass through the outer walls and connect to electrical terminals of the two RF devices (e.g., the plasma chamber and the impedance matcher) on opposite ends. Structures comprising cavities formed in recesses in outer walls of RF devices are described in further detail with reference to FIG. 2. In some embodiments, the material filling the insulating hole no is a solid dielectric (e.g., plastic, resin, or an insulating polymer), air, or a combination thereof.

Contiguous with the insulating hole no is an annulus-shaped insulating cavity 120 included in the coaxial transmission line structure 111 illustrated in FIG. 1. The top and bottom covering surfaces of the cavity 120 are not visible in FIG. 1; the covering surfaces are located above and below the portion of the coaxial transmission line structure in visible in FIG. 1. The cavity 120 may have various conductive and insulating parts placed in the cavity 120 (e.g., the RF signal pickup, as mentioned above). These are also not shown in FIG. 1 for clarity, but would be placed in the cavity 120, as seen, for example, in the embodiments 200A and 200B, illustrated in FIGS. 3A and 3B. The insulators in the cavity 120 may comprise a solid dielectric (e.g., plastic, resin, or an insulating polymer), or air, or a combination thereof. The outer surface 130 of the insulating hole no is an insulating boundary between the insulating hole no and the cavity 120. The cavity 120, being contiguous with the insulating hole no, extends radially outwards from the surface 130 up to the cavity wall 140, as illustrated in FIG. 1. Thus, the cavity 120 is bounded in the radial direction between the outer surface 130 of the insulating hole 110 and the cavity wall 140 formed around the outer periphery of the cavity 120. In this embodiment, the cavity wall 140 is also a sidewall of a recess in the conductive portion of the outer wall 150 of an RF device (e.g., a ceiling of the plasma chamber). Thus, the cavity wall 140 in FIG. 1 is a monolithic part of the outer wall 150. In some other embodiment, the cavity wall 140 may be an insulating material attached to a recessed surface of the conductive outer wall 150. The conductive portion of the outer wall 150 may comprise, for example, a metal such as aluminum or copper.

In the embodiments described in this disclosure, the cavity wall 140 is conductive. In some other embodiment, the cavity wall 140 may be insulating, for example, an insulating surface of the conductive outer wall 150 or an insulating material attached to the sidewall of the recess in the conductive outer wall iso.

The RF signal comprises RF voltage and RF current waveforms, V(t, x) and I(t, x), that are functions of time, t, and the location, x, along the RF center conductor 100. The RF voltage is defined with respect to a reference potential or ground. The RF current at any location of the RF center conductor 100 has an equal and opposite current, referred to as ground current, flowing through a respective conductor coupled to ground, the ground conductor being referred to as the ground shield. The RF signal pickup senses the electric field and magnetic field that represent average values of V(t, x) and I(t, x), averaged over an axial dimension of the RF signal pickup), hence denoted simply as time-varying voltage and current waveforms, V(t) and I(t).

The structure 111 in FIG. 1 is analogous to an RF coaxial transmission line. The center conductor of the coaxial transmission line is the RF center conductor 100. The respective ground shield is the conductive portion of the outer wall 150 around the RF center conductor 100. The ground shield, being at radial distances equal to or greater than that of the cavity wall 140, is outside the cavity 120, and is disposed around an annular insulating region comprising the insulating hole no and the cavity 120. The annular insulating region insulates the RF center conductor 100 from the respective ground shield.

An RF current 102 (indicated by a block arrow pointing downward) is shown flowing in the RF center conductor 100 at the location depicted in FIG. 1. The equal and opposite ground current 104 is shown flowing in the ground shield (indicated by two block arrows on two sides pointing upward). Although the arrows in the schematic are placed inside the body of the conductors, it is understood that the RF current in the RF center conductor 100 flows along the outer surface of the center conductor and the return ground current flows in the conductive outer wall 150 along the cavity wall 140, which is also the inner surface of the conductive outer wall 150. The various conductive and insulating parts (not shown) in the cavity 120 have been placed in a configuration designed to block any possible conductive path for the ground current to flow within a radial distance from the central axis that is less than the radial distance of the cavity wall 140. So, the insulating region comprising the insulating hole 110 and the cavity 120 diverts the ground current to flow outside the cavity 120 along a path going radially along the conductive covering surfaces and vertically in the conductive region alongside the cavity wall 140.

In order for a current pickup inside the insulating cavity 120 to sense a magnetic field, it is important to ensure that the return ground current be diverted to flow outside the insulating cavity 120, for example, along the conductive cavity wall 140 and/or the conductive portion of the outer wall 150 alongside the cavity wall 140. By Ampere's law, there exists a magnetic field with concentric circular field lines looping around the central axis of a cylindrical current-carrying conductor. Ampere's law states that at a radial distance, r, from the central axis of the cylindrical conductor, the magnetic field is proportional to (I/r), where, I is the perpendicular component of current flowing inside the circle of radius, r. Accordingly, an RF magnetic field, B(t), (indicated by a circular field line in FIG. 1) decreases as (i/r) with increasing radial distance, r, in the annular region between the RF center conductor 100 and the cavity wall 140. Since the only current flowing axially in this region is the RF current in the RF center conductor 100, B(t) is proportional to I(t), and the RF signal pickup may measure I(t) by sensing B(t) using, for example, a half-loop current pickup in the cavity 120. With further increase in r, the RF magnetic field, B(t), drops very rapidly in the conductive portion of the outer wall 150 radially outside the cavity wall 140. The abrupt drop in the magnetic field occurs because the equal and opposite ground current flowing in the conductive portion of the outer wall 150 is getting included in the current inside the circle of radius, r, bringing the total current down to almost zero within a short distance radially outwards from the cavity wall 140. Because of the high conductivity of the metallic ground shield, the ground current is similar to a surface current along the cavity wall 140 and, as predicted by Ampere's law, effectively shields the magnetic field, confining it to the annular region between the cavity wall 140 and the RF center conductor 100. Clearly, a return path for the ground current in this annular region would similarly suppress the magnetic field, thereby extinguishing the output of the magnetic field sensor of the RF signal pickup placed in the cavity 120.

In the axial direction, the cavity 120 extends between two conductive covering surfaces (not shown) of the cavity 120. The insulating hole no may extend further through the covering surfaces and outer walls of the RF device to allow the RF center conductor 100 to access a terminal in the first RF device on one end and another terminal in the second RF device on the opposite end.

In the example embodiments described in this disclosure, the first RF device is a plasma chamber and the second RF device is an impedance matcher coupled to an RF electrode of the plasma chamber. A first outer wall refers to an outer wall of the first RF device and a second outer wall refers to an outer wall of the second RF device.

In the embodiments described in this disclosure, each cavity that houses an RF signal pickup extends in the axial direction between two conductive covering surfaces. Each of the two conductive covering surfaces includes a portion of a surface of an outer wall of one of the two RF devices and/or a surface of a conductive component attached to the respective outer wall. Furthermore, the second RF device is positioned to have the second outer wall in close proximity and aligned to the first outer wall (an outer wall of the first RF device). The two conductive covering surfaces are disposed around an insulating hole (e.g., insulating hole no) that extends through the two respective outer walls. An RF center conductor (e.g., RF center conductor 100) passes through the insulating hole and accesses a terminal of the first RF device on one end and another terminal of the second RF device on the opposite end.

Figure 2:
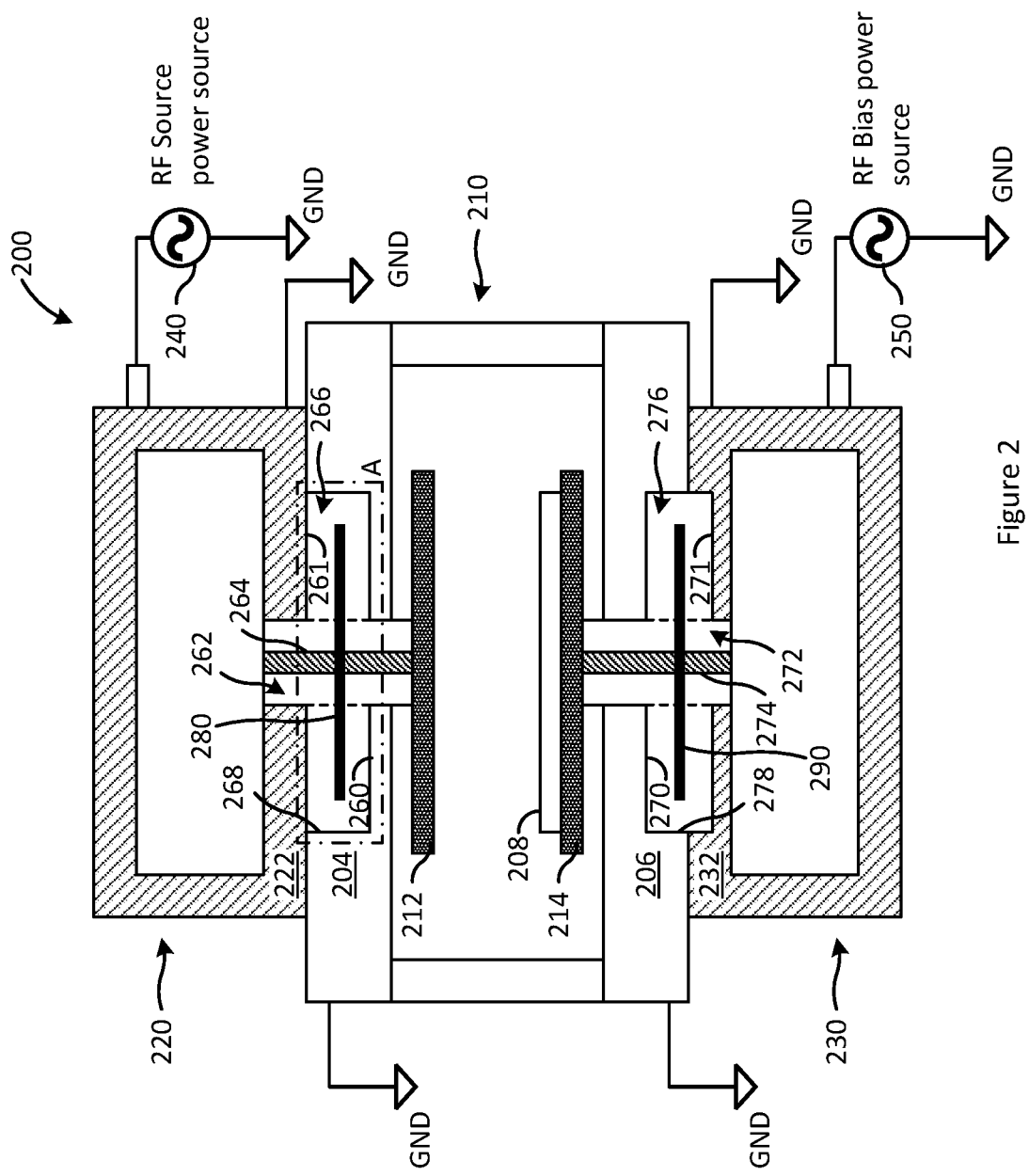
FIG. 2 illustrates a cross-sectional view of an RF system comprising RF signal pickups embedded in RF devices, in accordance with some embodiment.
Figure 3A:
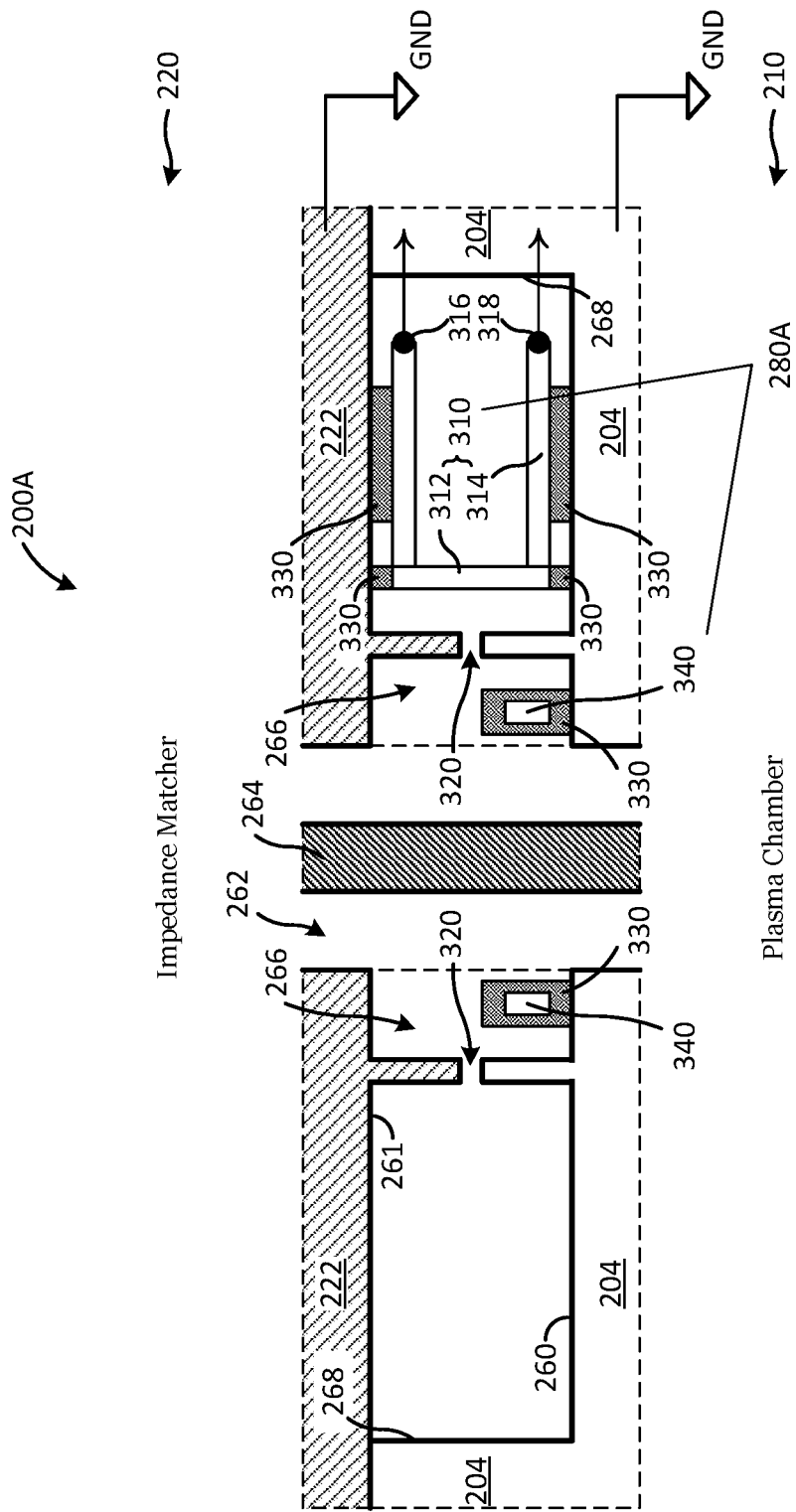
FIGS. 3A and 3B illustrate cross-sectional views of a portion of the RF system illustrated in FIG. 2.
Figure 3B:
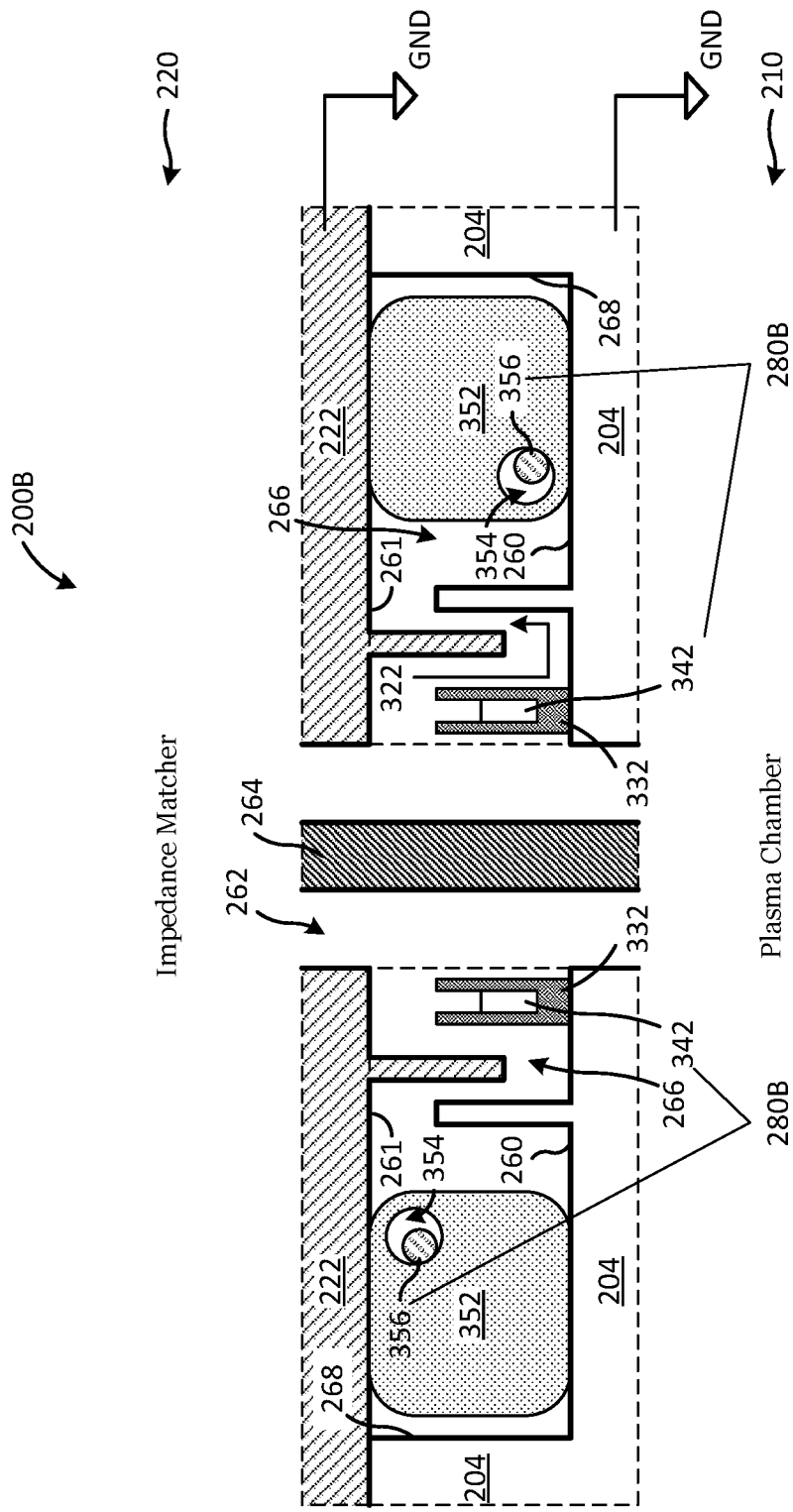

FIG. 2 illustrates an RF system 200 having two instances of the structure 111 (described with reference to FIG. 1) embedded in RF devices, illustrating two configurations in which RF sensor assemblies may be embedded in RF systems. The cavity 266 (or a portion of the cavity 276) housing a first RF signal pickup 280 is a recess formed in the first outer wall 204 (or a first outer wall 206) of the plasma chamber 210 (the first RF device). The first RF signal pickup 280 in cavity 266 and a second RF signal pickup 290 in cavity 276 are indicated schematically in FIG. 2. FIGS. 3A and 3B show two embodiments of the first RF signal pickup 280 in magnified views of the region A. The region A is indicated by a dot-dash rectangle in FIG. 2.

In the example embodiment illustrated in FIG. 2, the RF system 200 comprises a plasma chamber 210 configured as a capacitively-coupled plasma (CCP) chamber having a top RF electrode 212 and a bottom RF electrode 214. As illustrated in FIG. 2, the top electrode 212 is coupled to the first impedance matcher 220 that receives a first RF signal generated at an RF source, referred to as RF source power source 240. The bottom electrode 214 is coupled to a second impedance matcher 230, and is powered by a second RF signal originating from another RF source, referred to as RF bias power source 250. The bottom electrode 214 is also part of a substrate holder supporting a substrate 208 in FIG. 2.

In some other embodiment, the plasma chamber 210 may be configured as an inductively coupled plasma (ICP) chamber having, for example, a top RF electrode shaped like a planar coil over a dielectric (e.g., quartz) window of the plasma chamber 210.

As illustrated schematically in FIG. 2, the first RF center conductor 264 may couple the first RF signal to an electrical terminal of the top RF electrode 212, accessing the terminal through an insulating first insulating hole 262 extending through a first outer wall 204 of the plasma chamber 210. Likewise, the second RF signal may be transmitted along a second RF center conductor 274 to a terminal of the bottom electrode 214 accessed through a second insulating hole 272 extending through another first outer wall 206 of the plasma chamber 210. The RF system 200 is configured to acquire waveforms of the first and second RF signals using the first RF signal pickup 280 and the second RF signal pickup 290 of a first and a second sensor assembly, respectively. Accordingly, RF system 200 has two cavities: the first cavity 266 and the second cavity 276, each cavity housing a sensor assembly.

As illustrated in FIG. 2, the first cavity 266 is a confined space in a recess in the first outer wall 204 of the plasma chamber 210. The recess in the first outer wall 204 may be large enough to accommodate the first RF signal pickup 280 and associated components of a first sensor assembly. The first cavity 266 extends contiguously in a radial direction from the outer boundary of the first insulating hole 262 (indicated by dashed lines in FIG. 2) to a cavity wall 268. The cavity wall 268 is a sidewall of the recess and, hence, included in the first outer wall 204 of the plasma chamber 210 (the first RF device). Similarly, as explained in further detail below, one portion of the cavity wall 278 is a monolithic part of the first outer wall 206 of the plasma chamber 210 (the first RF device) and the remaining portion of the cavity wall 278 is a monolithic part of a second outer wall 232 of the second impedance matcher 23*o* (the second RF device in this instance). However, it is understood that, in some embodiment, the cavity wall may be a separate component attached to sidewalls of the recesses in outer walls of RF devices.

For the first cavity 266, a bottom surface of the recess in the first outer wall 204 may be a conductive region serving as a first conductive covering surface 26*o*. The first insulating hole 262 extends through the first conductive covering surface 260 and the first outer wall 204 of the plasma chamber 210 for the first RF center conductor 264 to access the top RF electrode 212. The first impedance matcher 220, which is the second RF device in this instance, is positioned to have a conductive surface of a portion of a second outer wall 222 sufficiently close to the plasma chamber 210 so as to cover the recess in the first outer wall 204. The conductive surface covering the recess is the second conductive covering surface 261 of the cavity 266. The first insulating hole 262 extends through the second outer wall 222 for the first RF center conductor 264 to access a terminal of the first impedance matcher 220.

Still referring to FIG. 2, the two conductive covering surfaces of each cavity (the first conductive covering surface 260 and the second conductive covering surface 261 of cavity 266 and the first conductive covering surface 270 and the second conductive covering surface 271 of cavity 276) and the conductive portion of the outer walls of each RF device (plasma chamber 210 and impedance matchers 220 and 230) are coupled to ground (a reference potential indicated by GND in all the figures). The first conductive covering surface 260 (a surface of the first outer wall 204 of the plasma chamber 210) and the second conductive covering surface 261 (a surface of the second outer wall 222 of the first impedance matcher 220) is effectively covering the cavity 266 in the axial direction. The central insulating hole 262 allows for the RF center conductor 264 to pass through the first outer wall 204 and the second outer wall 222.

In contrast to the recess in the first outer wall 204 (recess for cavity 266), the recess in the first outer wall 206 (recess for cavity 276) is an example where a recess in an outer wall of an RF device may accommodate a portion of a second RF signal pickup 290 and associated components a second sensor assembly. Since only a portion of the second sensor assembly is in the recess in the first outer wall 206, the second cavity 276 extends beyond the recess in the first outer wall 206 into an adjacent recess formed contiguously in the second outer wall 232 (an outer wall of the second impedance matcher 230), as illustrated in FIG. 2. The second impedance matcher 230 is the second RF device in this instance. Similar to the first impedance matcher 220, the second outer wall 232 is located in close proximity and aligned to the first outer wall 206 (outer wall of the first RF device, which is the plasma chamber 210). So, in this example, a recess has been formed in the second outer wall 232 to accommodate the remaining portion of the second sensor assembly. One portion of the cavity wall 278 is a sidewall of the recess in the first outer wall 206. The remaining portion of the cavity wall 278 is a sidewall of the recess in the outer wall 232. Thus, in this embodiment, the cavity wall 278 comprises sidewalls of two recesses. In some other embodiment, the cavity wall 278 may be a component attached to the sidewalls of the two recesses.

The second cavity 276, being the combination of the two recesses, is bounded in the axial direction between a first conductive covering surface 270 and a second conductive covering surface 271 that are the two bottom walls of the two recesses. The first conductive covering surface 270 of the second cavity 276 may be a surface that includes the bottom wall of the recess in the first outer wall 206. The second conductive covering surface 271 of the second cavity 276 may be a surface that includes the bottom wall of the recess in the second outer wall 232.

As illustrated in FIG. 2, the insulating hole 272 may extend through the second outer wall 232 at one end of the second cavity 276 and the first outer wall 206 at the opposite end of the second cavity 276. Thus, the insulating hole 272 allows the RF center conductor 274 to pass through and couple an electrical terminal of the second impedance matcher 230 to the bottom RF electrode 214 of the plasma chamber 210.

The RF system 200 has two coaxial transmission line structures. The first coaxial transmission line structure is between the first impedance matcher 220 and the plasma chamber 210. The conducting covering surfaces 260 and 261, (and respective outer walls 204 and 222) have apertures that have been aligned to form an insulating hole 262 around a single central axis that extends from the first RF device (the plasma chamber 210) to the second RF device (the first impedance matcher 220). The RF center conductor 264 passing through the insulating hole 262 may be used to transmit an RF signal. This RF signal may be detected by the first RF signal pickup 280 placed in the cavity 266 around the insulating hole 262.

The cavity 266 is also an insulating region contiguous with the insulating hole 262 and extending radially outwards to the cavity wall 268. The cavity 266 and the insulating hole 262 ensure that the combined insulating region is diverting the ground current around the cavity 266 by preventing any path for ground current to flow in the axial direction through any portion of the annular region extending radially from outside the RF center conductor 264 up to the cavity wall 268.

The second coaxial transmission line structure is between the second impedance matcher 230 and the plasma chamber 210. The two coaxial transmission line structures are configured similarly; the difference being the cavity 266 is in a recess in one RF device (the plasma chamber 210), while the cavity 276 extends between two contiguous recesses in two RF devices (the plasma chamber 210 and the second impedance matcher 230).

In some embodiments, the insulating hole and the insulating cavity comprise a continuous insulating space comprising air as the insulator. However, it is understood that in other embodiments, the insulating hole and/or the cavity may comprise some other insulator, for example, resin, plastic, or some other dielectric material.

In the example embodiment of the RF system 200, each conductive covering surface of the first cavity 266 and the second cavity 276 is a surface that is a portion of the outer wall of an RF device. In other words, the conductive covering surface and the conductive region of the outer wall form one monolithic structure. However, in various other embodiments, any of the conductive covering surfaces may be a surface of a detachable component attached to an outer wall of an RF device with connectors. Examples of embodiments with several different configurations of conductive covering surfaces are described in further detail below.

Embedding the RF signal pickup in the outer wall of the plasma chamber provides the advantage of shortening the signal path between the location from where the RF signal waveform is acquired and the location where the RF signal couples to the RF electrode. As mentioned above, this provides better information about the RF signal. If the information is fed to, for example, a controller that uses such feedback to adjust the RF signal to control plasma properties, the embodiments described in this disclosure may improve the accuracy of the feedback control system controlling the plasma process.

Another advantage of configuring the RF system to position the second outer (wall of the impedance matcher, which is the second RF device) in close proximity to the first outer wall (wall of the plasma chamber, which is the first RF device) and embed the sensor assembly in either or both walls is that it allows for a more compact RF system design. Otherwise, the RF system design may have to allow space, for example, a sufficient length of a coaxial RF pipe between the impedance matcher and the plasma chamber in order to be able to insert a sensor assembly that has its own housing. Moreover, the method of embedding an RF sensor assembly in the outer walls of RF devices may be used when an RF system has to be retrofitted with an RF signal pickup along the signal path between the impedance matcher and the plasma chamber, but there is insufficient space between the two RF devices to insert a sensor assembly. Generally, in a plasma processing system, there is a constraint on the space available for RF devices above the plasma chamber, so the impedance matcher for a top RF electrode is often located on top of the chamber, with little or no gap to insert a sensor assembly.

The RF signal pickup may be a current pickup, a voltage pickup, or a combination of a current pickup and a voltage pickup, referred to as an electromagnetic (EM) pickup and also known as a V-I sensor. In some embodiments, the RF signal pickup is a non-resonant signal pickup for broadband frequencies and harmonics. The RF signal pickup comprises conductive elements. The conductive elements are supported by insulating components so the conductive elements are insulated from other conductive components such as the conductive covering surfaces and the RF center conductor.

For the sake of simplicity, all insulating material in the cavity may be considered as part of the cavity, irrespective of the insulator being a gas (e.g., air) or a solid (e.g., plastic, resin, or an insulating polymer).

Examples of RF signal pickups suitable for placing in the cavity (e.g., the first cavity 266 and the second cavity 276 in FIG. 2) have been described in detail in the co-pending Related Applications mentioned above, and discussed briefly in this disclosure, in accordance with some embodiments. FIG. 3A illustrates an example RF signal pickup 280A and FIG. 3B illustrates an example RF signal pickup 280B placed in the first cavity 266. FIGS. 3A and 3B also illustrate two different configurations for electric-field shielding in the magnified cross-sectional views of the region A, indicated by a dot-dash rectangle in FIG. 2.

A magnified view of the region A in FIG. 2 is illustrated in FIG. 3A for an example RF system 200A. The example embodiment of the RF system 200A in FIG. 3A is an instance of the RF system 200 using an EM pickup as the first RF signal pickup 280A. In FIG. 3B, the first RF signal pickup 280A comprises a single-turn half-loop current pickup 310 and a voltage pickup 340. FIG. 3A illustrates a cross-sectional view of the single-turn half-loop current pickup 310 and the voltage pickup 340 supported by insulating components 330 inside the cavity 266. The two conductive covering surfaces 260 and 261 are coupled to ground.

The voltage pickup 340 is a conductive ring placed symmetrically around the common central axis of the first insulating hole 262 and the first RF center conductor 264. In this embodiment, the voltage pickup 340 is a complete ring. In some other embodiment, the voltage pickup 340 may be a partial ring. It is understood that, in various embodiments, the voltage pickup 340 may have various shapes exposed to the electric field in the cavity 266. The radial dimension of the insulating hole 262 spaces the voltage pickup 340 from the RF center conductor 264 to help prevent arcing due to a high potential difference between the RF center conductor 264 and the conductive voltage pickup 340. A signal wire (not shown) couples the voltage pickup 340 to a terminal (not shown) of the sensor assembly outside the cavity 266, where the terminal is coupled to a V-I analyzer. The V-I analyzer is configured to extract relevant information from the acquired waveforms to provide feedback to the controller of the process control system, as mentioned above. Typically, the voltage pickup 340 is terminated with a resistance (e.g., 50 ohms) to ground. The resistor may be located near the terminal as part of the sensor assembly or be in the V-I analyzer. An RF voltage of the first RF center conductor 264 relative to ground causes a time-varying RF electric field having electric field lines diverging from the surface of the RF center conductor 264 in a roughly radial direction perpendicular to the central axis. The electric field lines intersecting with the ring-shaped voltage pickup 340 induce oscillating charges in the conductive ring that produce an oscillating voltage signal across the terminating resistor that is proportional to the RF voltage in the RF center conductor 264, in accordance with Gauss' law. The acquired signal is transmitted to the V-I analyzer using, for example, a 50 ohm coaxial RF cable.

According to Ampere's law, a current flowing in a conductor along a fixed axis causes a circulating magnetic field around the axis. Although an RF current in the RF center conductor 264 induces such a magnetic field, its coupling with the voltage pickup 340 is negligible. The magnetic field is sensed by the current pickup 310, as explained below.

The current pickup 310 is a single-turn half-loop current pickup, the single turn comprising three conductive branches forming a continuous conductive path that partially encloses an area in a plane coplanar with the central axis. The three conductive branches of the single-turn half-loop current pickup 310 are two identical side branches 314 connected by one central branch 312 that is parallel to the central axis. The two side branches 314 are placed perpendicular to and equidistant from the center of the central branch 312, giving the current pickup 310 reflection symmetry about a mirror plane normal to the central axis.

Although, in the embodiment in FIG. 3A, the half-loop current pickup 310 has a single turn, it is understood that a similar current pickup with more than one turn may be used.

The RF current in the RF center conductor 264 causes a time-varying RF magnetic field having roughly concentric magnetic field lines in circles centered at the central axis and in planes oriented perpendicular to the central axis. Magnetic field lines thread through the rectangular area bounded on three sides by the three conducting branches of the single turn half-loop current pickup 310. The time-varying magnetic flux passing through the rectangular area induces an oscillating voltage signal proportional to the RF current in the RF center conductor 264, in accordance with Faraday's law. Signal wires 316 and 318 (illustrated in FIG. 3A) transmit this signal from the two open ends of the side conductors 314 to terminals (not shown) of the sensor assembly connected to a V-I analyzer. In some embodiments, the signal wires 316 and 318 provide a differential signal that may be coupled to the input terminals of a differential amplifier. In some other embodiments, one of the two signal wires 316 and 318 may be coupled to ground.

The signal output of a current pickup is perturbed by the RF electric field, unless the current pickup is adequately shielded from the electric field. Generally, the perturbation may not be ignored, unlike the typically negligible impact of the RF magnetic field on the signal from the voltage pickup, and some electric-field shielding scheme is included in the sensor design. A common method for shielding an RF electric field is inserting a grounded conductive plate between the source of the field and the current pickup. A metal (e.g., copper) plate, thicker than about 1 mm and shorted to ground, may provide sufficient electric-field shielding for the RF frequencies used for plasma processing.

The grounded conductive covering surfaces 260 and 261 of the cavity 266 may be used to shield the current pickup 310 from the RF electric-field emanating radially from the RF center conductor 264. In FIG. 3A, two conductive protrusions shaped like two overlaying rings, one protruding from the floor and the other from the ceiling of the cavity 266 are shown around the central axis. It is noted that an insulating slit 320 separates the two protrusions in the cavity 266. As explained above, the conductive components in the cavity 266 are configured such that the insulating region comprising the insulating hole 262 and the cavity 266 diverts the ground current to flow around the cavity 266. Without the slit 320 there would be a path for the ground current to flow from one conductive covering surface to the other through the protrusions. Because of the insulating slit 320, the ground current is forced to flow along a path going laterally alongside the first conductive covering surface 260 (in the outer wall 204) and alongside the second conductive covering surface 261 (in the outer wall 222), and vertically in the conductive region alongside the cavity wall 268.

Inside the insulating hole 262 and the insulating region of the cavity 266 adjacent to the insulating hole 262, the electric field is directed radially. The slit provides a line-ofsight path between the RF center conductor 264 and the single-turn half-loop current pickup 310. Hence, the insulating slit 320 may reduce the effectiveness of the shield (protrusions in the conductive covering surfaces 260 and 261) in preventing the electric field from interacting with the current pickup 310 in FIG. 3A. This may result in some coupling between the current pickup 310 and the electric field with the configuration of components being as illustrated in FIG. 3A. In some embodiments, the effectiveness of the shielding may be improved by extending the dimension of the voltage pickup 340 in the axial direction to cover a larger fraction of the insulating space between the two conductive covering surfaces 260 and 261, leaving no line-of-sight path between the RF center conductor 264 and the single-turn half-loop current pickup 310.

The single-turn half-loop current pickup 310, being located on one side of the RF center conductor 264, lacks axial symmetry. Because there is only one turn, the voltage signal generated between the signal wires 316 and 318 is relatively weak. Embodiments comprising an embedded axisymmetric multi-turn half-loop current pickup are described further below with reference to FIGS. 3B-3C and FIGS. 4A-4B.

A magnified view of the region A in FIG. 2 is illustrated in FIG. 3B for an example RF system 200B. The example embodiment of the RF system 200B in FIG. 3B is an instance of the RF system 200 using an EM pickup as its first RF signal pickup 280B. In FIG. 3B, the first RF signal pickup 280B comprises an axisymmetric multi-turn half-loop current pickup 356 and a voltage pickup 342. FIG. 3B illustrates the axisymmetric multi-turn half-loop current pickup 356 and the voltage pickup 342. Similar to the voltage pickup 340 in FIG. 3A, the voltage pickup 342 is a conductive ring placed symmetrically around the common central axis of the first insulating hole 262 and the first RF center conductor 264. The insulating component 332 supporting the voltage pickup 342 inside the cavity 266 is a groove in which the conductive ring has been inserted.

The multi-turn half-loop current pickup 356, illustrated in FIG. 3B, is a conductive wire with two ends and is being supported by a toroidal mandrel 352. The conductive wire (which is the current pickup 356) is threaded along a hollow passage 354 in the mandrel 352 coiling around an internal axis of the toroid. In this example, the mandrel 352 comprises an insulator shaped like a toroid with a rectangular cross-section. The toroidal mandrel 352 is positioned symmetrically around the central axis in the cavity 266. Accordingly, the internal axis of the toroid is roughly a circle in a plane normal to the central axis and concentric with the insulating hole 262. Winding symmetrically around the internal axis is the hollow passage 354 and, along with the hollow passage 354, the conductive wire coils symmetrically around the internal axis forming a multi-turn coil, which is the current pickup 356. The two ends of the current pickup 356, which are the two ends of the coiled wire, may be directed from the mandrel 352 to two terminals of the sensor assembly.

Figure 3C:
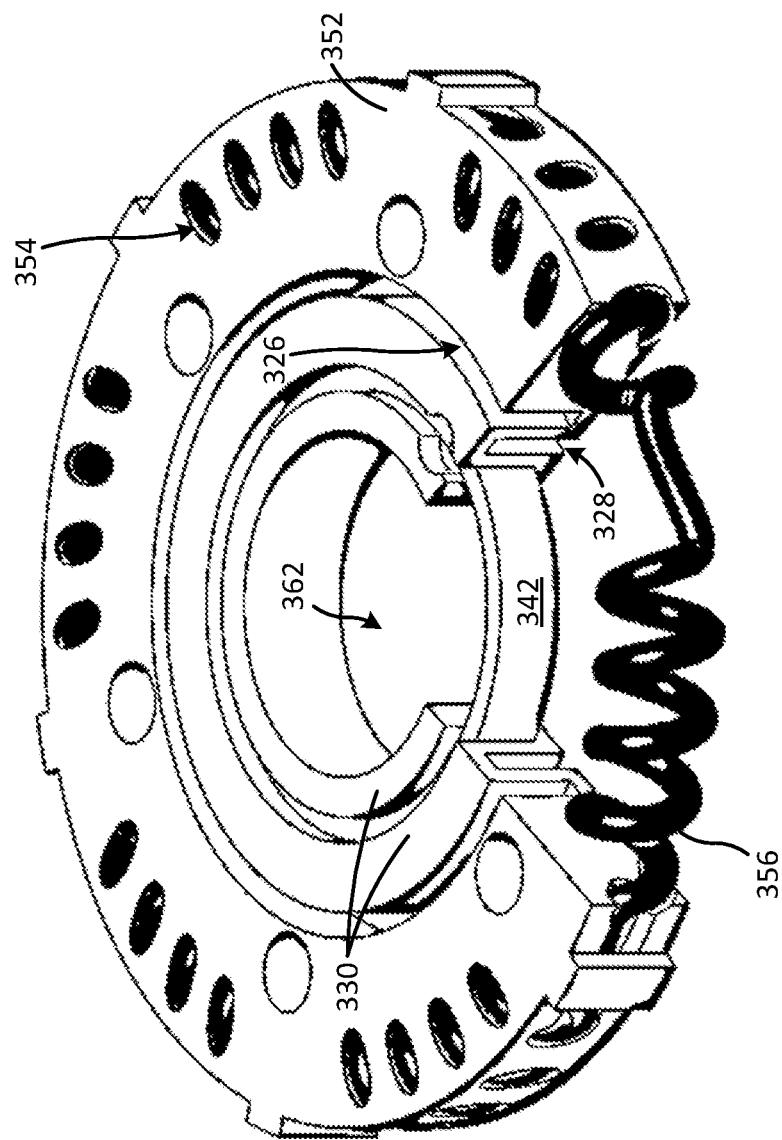
FIG. 3C illustrates a 3D view of a current pickup, in accordance with some embodiment.

The three dimensional (3D) structure of the current pickup 356 in the hollow passage 354 of the mandrel 352 is illustrated in FIG. 3C. The two ends of the current pickup 356 are not visible in FIG. 3C. The slots 326 and 328 in the insulating material between the voltage pickup 342 and the current pickup 356 is for conductive protrusions in the first and the second conductive covering surfaces used for electric-field shielding of the current pickup 356. The electric-field shielding scheme used for shielding the current pickup 356 is described in further detail below with reference to FIG. 3B.

In FIG. 3B, the configuration of the conductive protrusions of the two conductive covering surfaces 260 and 261 used for electric-field shielding is more effective than that in FIG. 3A. As illustrated in FIG. 3B, the conductive protrusions disposed around the insulating hole 262 extend into the cavity 266 more than halfway to the opposite side, leaving no line-of-sight path between the RF center conductor 264 and the current pickup 356. In contrast, the conductive protrusions illustrated in FIG. 3A extend from the floor (the first conductive covering surface 260) or the ceiling (the second conductive covering surface 261) less than halfway into the cavity 266, forming the slit 320 between the protrusions in FIG. 3A that provides a line-of-sight path between the RF center conductor 264 and the current pickup 310, thereby compromising the effectiveness of the electric field shield. In the embodiment in FIG. 3B, the line-of-sight path has been eliminated without creating a conductive path between the first conductive covering surface 260 and the second conductive covering surface 261 through the cavity 266 by offsetting the radial location of the two protrusions. The length of each conductive protrusion in FIG. 3B is less than the space between the two conductive covering surfaces of the cavity 266. So, there is an insulating gap between the first conductive protrusion (protruding from the first outer wall 204 of the plasma chamber 210) and the conductive outer cover 222 of the first impedance matcher 220 on the opposite side. Likewise, an insulating gap keeps the second conductive protrusion insulated from the first outer wall 204 of the plasma chamber 210. However, the combined lengths of the first conductive protrusion and the second conductive protrusion in FIG. 3B exceed the space between the two conductive covering surfaces. In the radial direction, the ring-shaped first conductive protrusion is located at a fixed offset distance from the second conductive protrusion, as illustrated in FIG. 3B. This configuration of conductive protrusions provides a zig-zag, labyrinthine dielectric region 322. Because of the labyrinthine dielectric region 322, the ground current in FIG. 3B is forced to flow outside the cavity 266 along the same path as described above with reference to FIG. 3A. With the labyrinthine dielectric region 322, the insulating cavity 266 prevents any current flow between the first conductive covering surface 260 and the second conductive covering surface 261 through any portion of the annular region extending radially from outside the RF center conductor 264 up to the cavity wall 268.

Figure 4A:
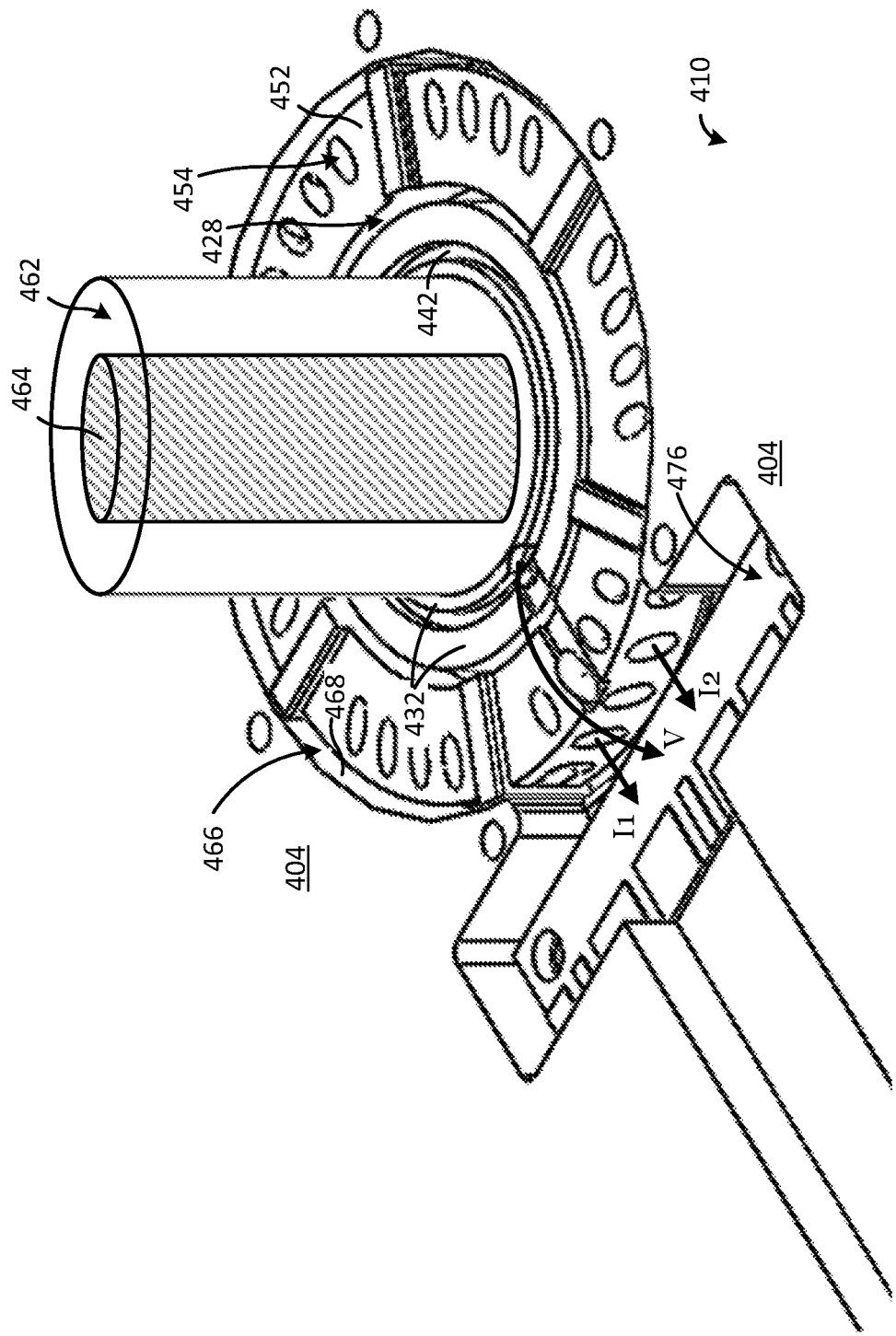
FIG. 4A illustrates a 3D view of an embedded sensor assembly in an RF system, in accordance with some embodiment.
Figure 4B:
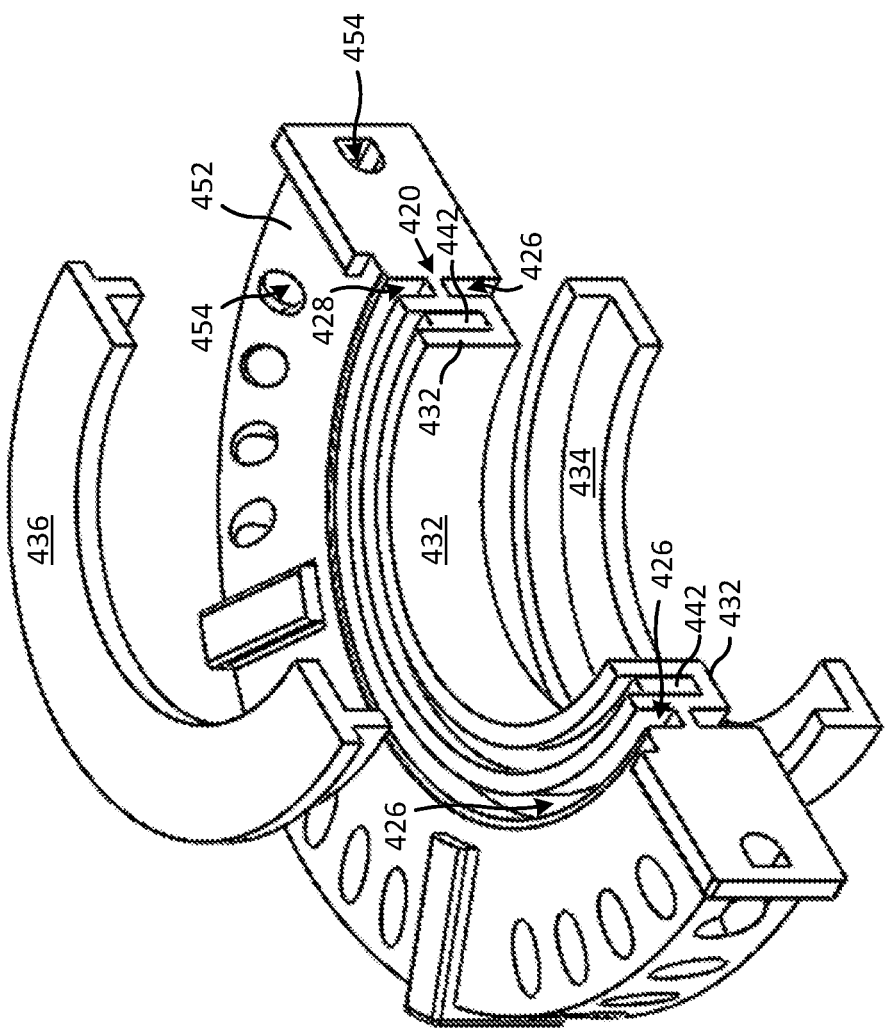
FIG. 4B illustrates an exploded cross-sectional view of a sensor assembly, in accordance with some embodiment.

The structure of the sensor assembly having the embedded RF signal pickup 280B comprising the ring-shaped voltage pickup 342 and the multi-turn half-loop current pickup 356 (illustrated in FIG. 3B and FIG. 3C) is further explained using a 3D view of a similar embedded sensor assembly in FIG. 4A and an exploded cross-sectional view in FIG. 4B.

FIG. 4A illustrates a 3D view of a part of an RF system having an embedded RF sensor assembly that is similar to the sensor assembly described above with reference to FIG. 3B. A cavity 466 is a recess in a first outer wall 404 of a plasma chamber 410 (the first RF device). The configuration of the conductive protrusions used for electric-field shielding in this example is different from the configuration of the conductive protrusions illustrated in FIG. 3B but similar to the protrusions illustrated in FIG. 3A. In FIG. 3B a zig-zag, labyrinthine dielectric region 322 isolates the protrusions, whereas a dielectric slit, similar to the slit 320 is being used for isolating the protrusions in the sensor assembly in FIG.

4A. It is noted that, although the dielectric material used for isolating the protrusions may be a solid (e.g., plastic or polytetrafluoroethylene (PTFE)), the insulating structure between the two conductive protrusions is being referred to as a slit.

An insulating groove 428 in an insulating component 432 is shown in FIG. 4A. The insulating groove 428 may be used for a conductive protrusion of a conductive covering surface covering the recess, but the protrusions and the slit are not visible in FIG. 4A; they are described further below with reference to an exploded cross-sectional view of a part of the sensor assembly, illustrated in FIG. 4B.

In FIG. 4A, a toroidal mandrel 452 for a current pickup of an RF sensor assembly has been included in the cavity 466. A ring-shaped voltage pickup 442 is shown supported in a groove of the insulating component 432, similar to the voltage pickup 342 and the insulating component 332 in FIG. 3B. The cavity 466 is bounded radially on the outer side by a cavity wall 468. An RF center conductor 464 is shown passing through an insulating hole 462 around a common central axis to access the plasma chamber 410 below the first outer wall outer wall 404. The second RF device (the impedance matcher) has been removed from FIG. 4A to show the components embedded in the first outer wall 404 of a plasma chamber 410.

The toroidal mandrel 452 in FIG. 4A is similar to the mandrel 352 in FIG. 3B. Access holes to a hollow passage 454 are visible from the top and sides of the mandrel 452. A conductive wire that may be wound around a circular internal axis of the toroid through the hollow passage 454 to form a multi-turn axisymmetric current pickup (similar to the current pickup 356 in FIG. 3C) has been removed for clarity. Two arrows marked I1 and I2 in FIG. 4A indicate that the two ends of the current pickup (not shown) may extend through two access holes of the hollow passage 454 to be connected to terminals (not shown) in an optional adjacent recessed region 476 in the first outer wall 404 of a plasma chamber 410. A third arrow marked V indicates that a signal wire (not shown) may extend from the voltage pickup 442 to a terminal (not shown) in the recessed region 476. The recessed region 476 may include further electrical components such as electronic circuitry electrically coupled to the terminals. The electronic circuitry may be used to perform signal processing and analysis of the acquired signal waveforms.

An additional recess (in addition to the recesses for housing a signal pickup) for electrical components (e.g., the optional recessed region 476) provides several advantages. In addition to making the V-I measurement system more compact, a signal-to-noise ratio (SNR) of the measurement system may be reduced by placing associated circuitry such as a low-noise amplifier in a shielded compartment in close proximity to the signal pickup.

FIG. 4B illustrates an exploded cross-sectional view of a portion of the sensor assembly in FIG. 4A. In FIG. 4B, the insulating component 432 and the toroidal mandrel 452 which has the hollow passage 454 together form a connected insulating component that may be included in the cavity 466 shown in FIG. 4A. In the exploded cross-sectional view, a first shielding component 434 having a first conductive protrusion near its edge is shown below the mandrel 452 and the insulating component 432. A surface of the first shielding component 434 is a portion of the first conductive covering surface of the cavity 466. In some embodiment, the first shielding component 434 may be attached to, for example, a bottom surface of the recess in the outer wall 404 of plasma chamber 410 in FIG. 4A. In some other embodiment, the first shielding component 434 may be a monolithic part of the outer wall 404 of the plasma chamber 410, similar to the protrusion in the outer wall 204 of the plasma chamber 210 illustrated in FIG. 3B. A second shielding component 436 having a second conductive protrusion close to its center is shown above the mandrel 452 and the insulating component 432. Similar to the first shielding component 434, a surface of the second shielding component 436 is a portion of the second conductive covering surface of the cavity 466. In some embodiment, the second shielding component 436 may be attached to, for example, a bottom surface of the outer wall of an impedance matcher. In some other embodiment, the second shielding component 436 may be a monolithic part of the outer wall of the impedance matcher, similar to the protrusion in the outer wall 222 of the impedance matcher 220 illustrated in FIG. 3B.

The insulating component 432 has several grooves. When the sensor assembly is assembled, each conductive protrusion of the first shielding component 434 and the second shielding component 436 would be in a groove in the insulating component 432. Going radially outwards from a central axis of the structure illustrated in FIG. 4B, the first groove in the insulating component 432 supports the voltage pickup 442. Going further radially outwards there are two grooves 426 and 428 overlaying each other, directly below and above a solid dielectric slit 420. The first conductive protrusion (in the first shielding component 434) fits in groove 426 from below and the second conductive protrusion (in the second shielding component 436) fits in groove 428 from above. In this example, the first and the second conductive protrusions are shaped like rings and the first conductive protrusion is overlaying with the second conductive protrusion, similar to the shielding configuration described earlier with reference to FIG. 3A. The dielectric slit 420 in FIG. 4A is analogous to the dielectric slit 320 in FIG. 3A.

It is understood that sensor assemblies having various current pickup and voltage pickup designs and various shielding configurations may be embedded in RF devices of an RF system. Some examples, in addition to those described above, are provided below. In some example, an axisymmetric multi-turn half-loop current pickup may be a wire coiled in a groove on the outer surface of a toroidal mandrel and sealed with a polymer, such as resin. In some other example, two voltage pickups may be placed symmetrically on two sides of a single-turn half loop current pickup and a differential signal from the two voltage pickups may be used to improve the accuracy in measuring the phase difference between the current waveform and the voltage waveform. In another example, more than two conductive protrusions may be used for shielding electric-fields. In another different example, only one conductive protrusion may be used for electric-field shielding. In yet another example, the voltage pickup may also be used as a shielding component, although it is not shorted to ground.

The surface of the first shielding component facing the cavity is a portion of the first conductive covering surface of the recess and the surface of the second shielding component facing the cavity is a portion of the second conductive covering surface of the recess. The first shielding component may be attached to the first outer wall (an outer wall of the first RF device) or may be a portion of the first outer wall. Likewise, the second shielding component may be attached to the second outer wall (an outer wall of the second RF device) or may be a portion of the second outer wall. Depending on how the shielding components have been integrated into the sensor assembly the shielding configuration of the sensor assembly may be referred to as external shielding, internal shielding, or hybrid shielding. For example, the first shielding component 434 may be attached to the first outer wall 404 (of the plasma chamber 410), and the second shielding component 436 may be attached to the second outer wall (e.g., an outer wall of an impedance matcher). This configuration where the shielding components are attached to (as opposed to being a portion of) the outer walls of the first RF device and the second RF device is referred to as external shielding in this disclosure. In contrast, internal shielding implies that each of the two electric-field shielding components is an integral portion of a conductive region of an outer wall of an RF device, the shielding component and the conductive covering surface forming one monolithic conductive structure. The RF system 200 described with reference to FIG. 2 and FIGS. 3A-3B is an example of an RF system having an embedded sensor assembly using an internal shielding configuration. A hybrid shielding configuration refers to a shielding configuration where both external and internal shielding has been used in the same sensor assembly. For example, the first shielding component may be a monolithic part of the first outer wall of a plasma chamber, but the second shielding component may be a separate component attached to the outer wall of an impedance matcher.

Figure 5:
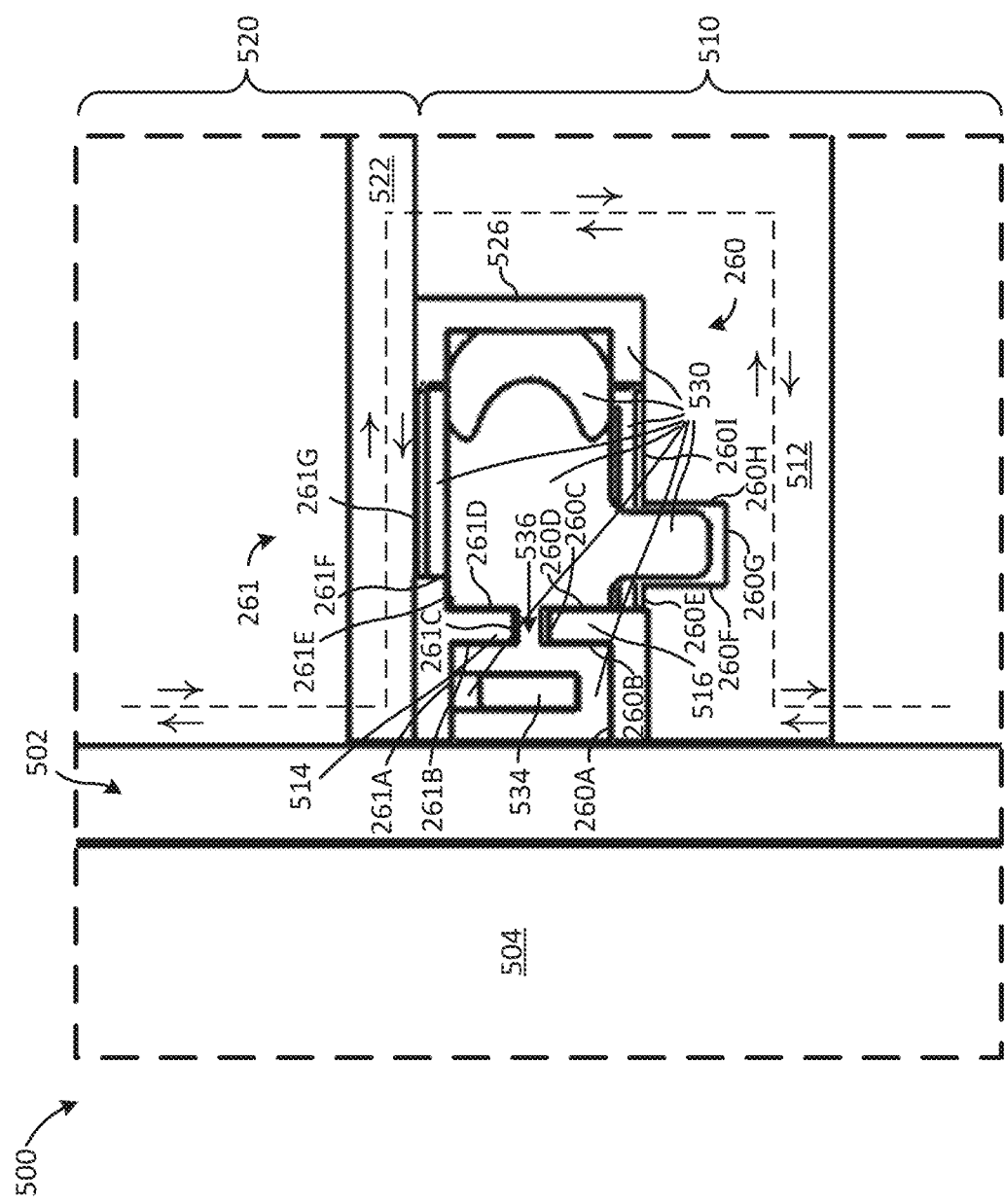
FIG. 5 illustrates a cross-sectional view of a portion of an RF system having an embedded RF sensor assembly using external shielding, in accordance with some embodiment.
Figure 6:
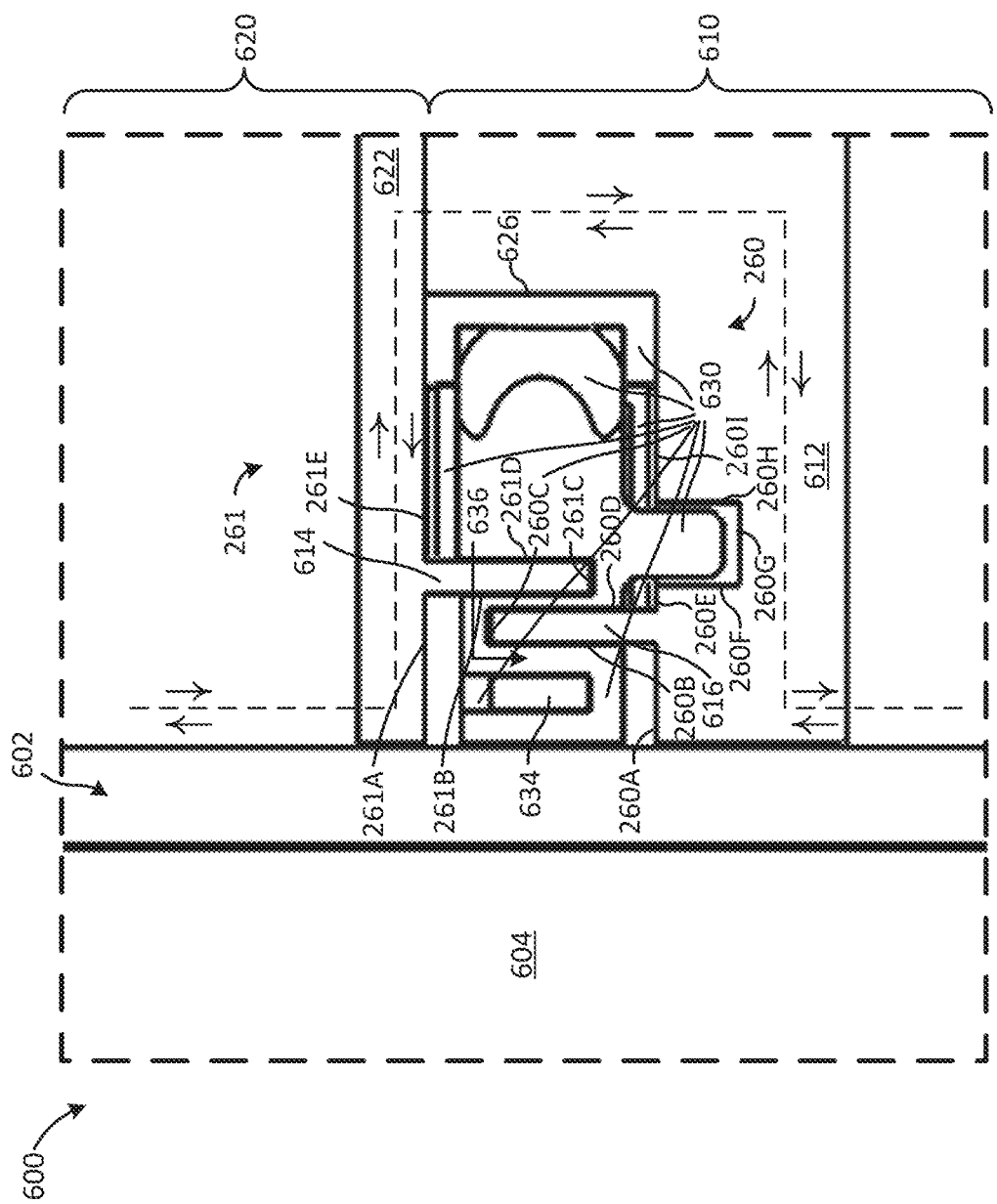
FIG. 6 illustrates a cross-sectional view of a portion of an RF system having an embedded RF sensor assembly using internal shielding, in accordance with some embodiment.
Figure 7:
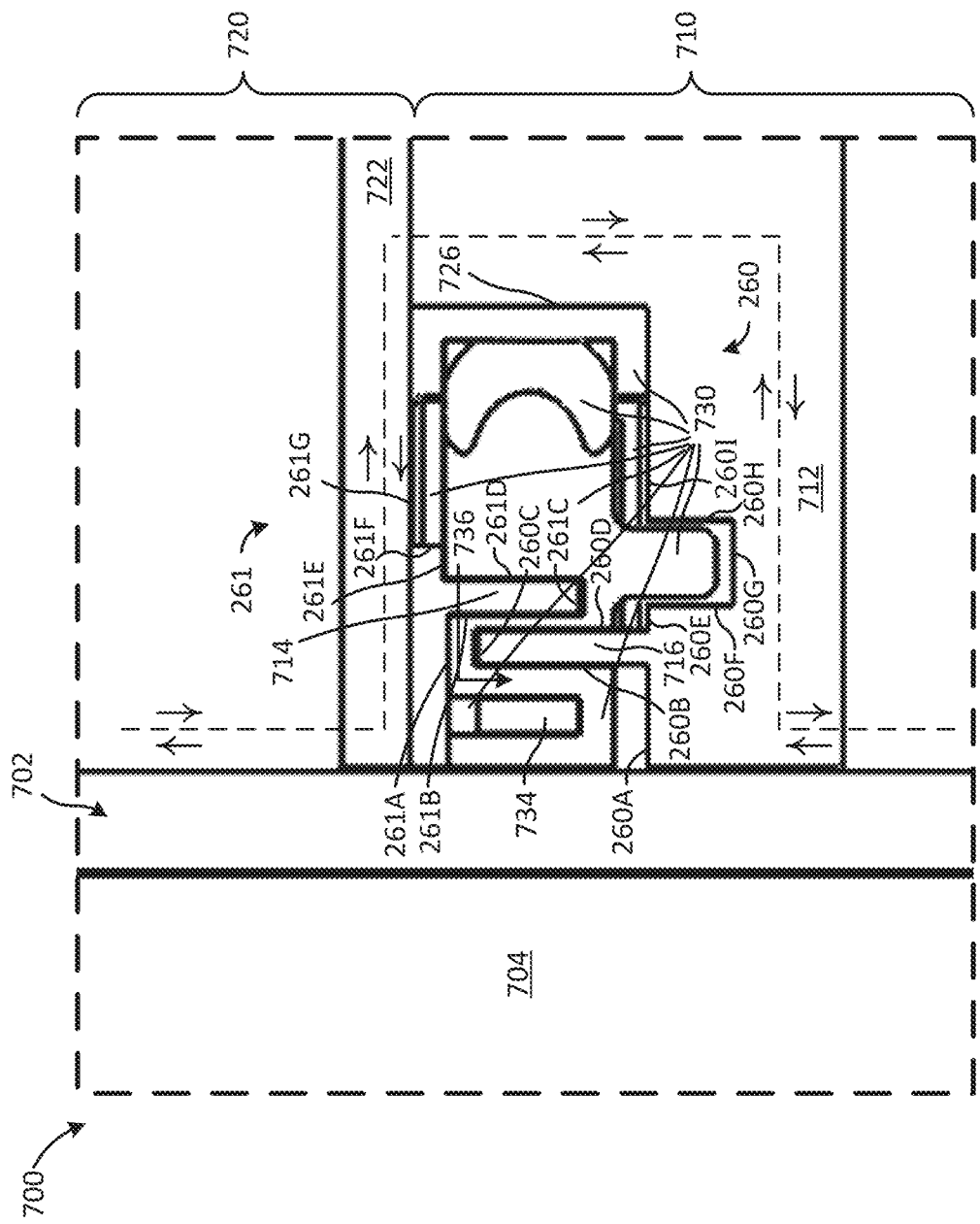
FIG. 7 illustrates a cross-sectional view of a portion of an RF system having an embedded RF sensor assembly using hybrid shielding, in accordance with some embodiment.

Three types of embodiments based on the three ways in which shielding components may be incorporated in the RF sensor assembly are described briefly with reference to FIGS. 5-7. As mentioned above, the three ways are external shielding, internal shielding, and hybrid shielding. In FIGS. 5-7, the sensor assemblies are axisymmetric; hence only one side of the central axis has been displayed in the Figures.

FIG. 5 illustrates a cross-sectional view of a portion of an RF system 500 having an embedded RF sensor assembly using external shielding. In FIG. 5, the first RF device is a plasma chamber 510 having a first outer wall 512, and the second RF device is an impedance matcher 520 having a second outer wall 522. An insulating hole 502 has an RF center conductor 504 for transmitting an RF signal between the impedance matcher 520 and the plasma chamber 510. A recess in the first outer wall 512 (outer wall of the plasma chamber 510) is filled with various components of a sensor assembly. The second outer wall 522 (outer wall of the impedance matcher 520) is disposed over the recess. As illustrated in FIG. 5, the first conductive covering surface 260, includes a first surface region 260A, a second surface region 260B, a third surface region 260C, a fourth surface region 260D, a fifth surface region 260E, a sixth surface region 260F, a seventh surface region 260G, an eight surface region 260H, and a ninth surface region 260I. The second conductive covering surface 261, includes a first surface region 261A, a second surface region 261B, a third surface region 261C, a fourth surface region 261D, a fifth surface region 261E, a sixth surface region 261F, and a seventh surface region 261G.

A first conductive shielding component 516 having a first protrusion is attached to the first outer wall 512 of the plasma chamber 510. A second conductive shielding component 514 having a second protrusion is attached to the outer wall 522 of the impedance matcher 520. The two conductive protrusions are overlaying each other, but a dielectric slit 536 prevents any ground current flowing between the first conductive protrusion of the first conductive shielding component 516 and the second conductive protrusion of the second conductive shielding component 514. Here, the first conductive shielding component 516 is attached to the first outer wall 512 of the plasma chamber 510, and the second conductive shielding component 514 is attached to the first outer wall 522 of the impedance matcher 520. Since the first shielding component 516 and the second shielding component 514 are components that are separate from the first outer wall 512 of the plasma chamber 510 and the outer wall 522 of the impedance matcher 520, respectively, the embedded sensor assembly of RF system 500 is using external shielding.

In the example illustrated in FIG. 5, various insulating components used for supporting and insulating the conductive voltage pickup 534 and the conductive current pickup (not visible), and for insulating the conductive shielding components 516 and 514 are filling the empty space in the recess. So, we shall refer to all the dielectric material, including the insulating components, as the cavity 530. Accordingly, the cavity 530 extends radially outwards from the outer surface of the insulating hole 502 to a cavity wall 526. It is noted that, although the cavity (e.g., the cavity 530) is insulating, the wall (e.g., the cavity wall 526) may be conductive. The insulating hole 502 and cavity 530 forces the ground current to flow outside the cavity 530. The ground current in the grounded conductive regions of the first outer wall 512 and the second outer wall 522 is diverted to flow around the cavity 530 alongside the periphery of the cavity 530. For example, the ground current may flow radially in the conductive regions alongside the first conductive covering surface 260, axially alongside the cavity wall 526, and again radially alongside the second conductive covering surface 261, as indicated schematically in FIG. 5 by a dashed line with pairs of arrows to indicate current flow in both directions. It is understood that the ground current path is only a schematic and the ground current flow lines would be distributed with a concentration of current near the periphery of the cavity 530. However, none of the ground current flow lines would be inside the cavity 530.

FIGS. 6 and 7 illustrate cross-sectional views of a portion of RF systems 600 and 700, respectively. Each of the RF systems 600 and 700 has an embedded RF sensor assembly. Since the components of the RF systems 600 and 700 are very similar to respective components of the RF system 500, we have limited the description to the differences between the systems. Similar components in the three example RF systems are assigned numerical references that differ only in the most significant digit. If the most significant digit is the numeral 5 then the component belongs to the RF system 500, the numeral 6 indicates the RF system 600, and the numeral 7 indicates the RF system 700.

FIG. 6 illustrates a cross-sectional view of a portion of an RF system 600 having an embedded RF sensor assembly using internal shielding. It is noted that there are several differences between the sensor assembly of RF system 600 and that of RF system 500. The first shielding component 616 is a monolithic part of the first outer wall 612 of the plasma chamber 610, and the second shielding component 614 is a monolithic part of the outer wall 622 of the impedance matcher 620. Furthermore, the conductive protrusions of the shielding components 614 and 616 form a zig-zag, labyrinthine dielectric region 636, whereas the shielding components 514 and 516 form a dielectric slit 536. As illustrated in FIG. 6, the first conductive covering surface 260, includes a first surface region 260A, a second surface region 260B, a third surface region 260C, a fourth surface region 260D, a fifth surface region 260E, a sixth surface region 260F, a seventh surface region 260G, an eight surface region 260H, and a ninth surface region 260I. The second conductive covering surface 261, includes a first surface region 261A, a second surface region 261B, a third surface region 261C, a fourth surface region 261D, and a fifth surface region 261E. Since the first shielding component 616 and the second shielding component 614 are monolithic parts of the first outer wall 612 of the plasma chamber 610 and the outer wall 622 of the impedance matcher 620, respectively, the embedded sensor assembly of RF system 600 is using internal shielding.

The ground current path in the RF system 600 in FIG. 6 (shown schematically by a dashed line with pairs of arrows to indicate current flow in both directions) is similar to that in the RF system 500 in FIG. 5.

FIG. 7 illustrates a cross-sectional view of a portion of an RF system 700 having an embedded RF sensor assembly using hybrid shielding. There is just one difference between the sensor assembly of RF system 700 and that of RF system 600. The second shielding component 714 is a separate component that is attached to the outer wall 722 of the impedance matcher 720. Accordingly, as illustrated in FIG. 7, the first conductive covering surface 26o, includes a first surface region 260A, a second surface region 260B, a third surface region 260C, a fourth surface region 260D, a fifth surface region 260E, a sixth surface region 260F, a seventh surface region 260G, an eight surface region 260H, and a ninth surface region 260I. The second conductive covering surface 261, includes a first surface region 261A, a second surface region 261B, a third surface region 261C, a fourth surface region 261D, a fifth surface region 261E, a sixth surface region 261F, and a seventh surface region 261G. The first shielding component 716 is a monolithic part of the first outer wall 712 of the plasma chamber 710. Since the first shielding component 716 is a monolithic part of the first outer wall 712 of the plasma chamber 710, and the second shielding component 714 is separate from the outer wall 722 of the impedance matcher 720, the embedded sensor assembly of RF system 700 is using hybrid shielding.

The ground current path in the RF system 700 in FIG. 7 (shown schematically by a dashed line with pairs of arrows to indicate current flow in both directions) is similar to that in the RF system 500 in FIG. 5.

FIG. 8 illustrates a block diagram for a method 800 of embedding an RF sensor assembly in an RF system. As mentioned above, the method may also be applied to retrofit an RF system to embed an RF sensor in the RF devices of the RF system. As indicated in block 810, the method 800 comprises having an RF system, where the RF system includes a first RF device (e.g., a plasma chamber) having an outer wall and a second RF device (e.g., an impedance matcher) having an outer wall in close proximity to the outer wall of the first RF device. The outer wall of the first RF device and the outer wall of the second RF device each have an aperture extending through the respective outer wall. Furthermore, the outer wall of the second RF device is aligned to the first RF device. The alignment forms an insulating central insulating hole having a common central axis extending through the outer walls. The insulating central insulating hole allows for an RF center conductor to pass through the insulating hole and electrically couple the two RF devices. In some embodiments, the insulating central insulating hole may comprise air. In some other embodiments, the insulating hole may be filled with a solid dielectric (e.g., resin, plastic, or an insulating polymer). In various embodiments, the insulating central insulating hole may comprise a combination of gaseous and solid dielectric material.

As shown in block 820, in method 800, a first recess is formed in a conductive region of the outer of the first RF device. The recess is formed around the insulating central insulating hole. Components of the sensor assembly (e.g., an RF signal pickup) may be subsequently placed in a cavity comprising a portion of the recess around the insulating central insulating hole. After forming the recess, a first cover of the RF sensor assembly is embedded in the first recess, as indicated in block 830. In some embodiments, the first cover is a surface of a component attached to a bottom surface of the first recess. In some other embodiments, the first cover may comprise a monolithic part of the bottom surface of the first recess. The first cover may include conductive shielding components for shielding a current pickup from an electric field coupling with the current pickup. The first recess is covered after placing the RF sensor assembly in the first recess, as indicated in block 840 of the method 800. Covering the first recess implies covering the side of the first recess opposite the first cover. It is understood that the covering surface is around the insulating central insulating hole to allow the RF center conductor to pass through and couple the two RF devices. Covering the first recess may comprise attaching the outer wall of the second RF device over the first recess. In some embodiments, the method 800 may further comprise forming a second recess in a conductive region the outer wall of the second RF device, aligning the second recess to the first recess, and embedding the second cover of the sensor assembly in the second recess in the outer wall of the second RF device. In some embodiments, the second cover is a surface of a component attached to a bottom surface of the second recess. In some other embodiments, the first cover may comprise a monolithic part of the bottom surface of the second recess.

Example 1. A radio frequency (RF) system including: a first RF device having a first outer wall; a first conductive covering surface, a portion of the first conductive covering surface including a portion of the first outer wall; a second RF device having a second outer wall, the first RF device being electrically coupled to the second RF device; a second conductive covering surface, a portion of the second conductive covering surface including a portion of the second outer wall; an insulating hole for an RF center conductor extending through the first conductive covering surface and the second conductive covering surface; a cavity disposed between the first conductive covering surface and the second conductive covering surface, the cavity being an insulating region; and an RF signal pickup disposed in the cavity.

Example 2. The system of example 1, where the RF signal pickup includes: a current pickup, the current pickup having two ends; or a voltage pickup; or an electromagnetic (EM) pickup, the EM pickup being a combination of a current pickup and a voltage pickup, the voltage pickup being interposed between the current pickup and the insulating hole.

Example 3. The system of one of examples 1 or 2, further including a conductive region disposed outside the cavity and the insulating hole, and coupling the first conductive covering surface to the second conductive covering surface, where the conductive region, the first conductive covering surface, and the second conductive covering surface are coupled to a reference potential.

Example 4. The system of one of examples 1 to 3, further including a cavity wall disposed in a peripheral region of the cavity, the cavity being contiguous with the insulating hole and bounded in a radial direction by the cavity wall and an outer surface of the insulating hole.

Example 5. The system of one of examples 1 to 4, where a portion of the cavity is a recess in the outer wall of the first RF device.

Example 6. The system of one of examples 1 to 5, where the current pickup is a half loop, the two open ends of the half loop being the two ends of the current pickup.

Example 7. The system of one of examples 1 to 6, where the current pickup is a multi-turn half loop shaped like a coil winding symmetrically around an internal axis, the internal axis being concentric with the insulating hole.

Example 8. The system of one of examples 1 to 7, where the cavity further includes electrically insulating components, the components mechanically supporting the current pickup in a fixed position within the cavity.

Example 9. The system of one of examples 1 to 8, where the cavity further includes a mandrel disposed symmetrically around the insulating hole, the mandrel being an insulator shaped like a toroid mechanically supporting the current pickup.

Example 10. The system of one of examples 1 to 9, where the voltage pickup is shaped like a ring disposed symmetrically around the insulating hole.

Example 11. The system of one of examples 1 to 10, where the voltage pickup is shaped like a partial ring disposed around the insulating hole.

Example 12. The system of one of examples 1 to 11, where the cavity further includes electrically insulating components, the components mechanically supporting the RF signal pickup.

Example 13. The system of one of examples 1 to 12, further including terminals disposed in a recessed region in the first outer wall, the terminals being coupled to the RF signal pickup, where the recessed region further includes electronic circuitry electrically coupled to the terminals.

Example 14. The system of one of examples 1 to 13, where a frequency of a RF signal picked up at the RF signal pickup is between 300 kHz and 200 MHz.

Example 15. The system of one of examples 1 to 14, where the RF signal pickup is a non-resonant signal pickup for broadband frequencies and harmonics.

Example 16. The system of one of examples 1 to 15, where the first RF device is a plasma chamber.

Example 17. A radio frequency (RF) system including: a first conductive covering surface, a portion of the first conductive covering surface including a portion of the first outer wall of a first RF device; a second conductive covering surface aligned to the first conductive covering surface, the second conductive covering surface being disposed around the insulating hole; an insulating hole for an RF center conductor extending through the first conductive covering surface and the second conductive covering surface, the first conductive covering surface and the second conductive covering surface being disposed around the insulating hole; a cavity bounded by the first conductive covering surface and the second conductive covering surface, the cavity being an insulating region; and an RF signal pickup disposed within the cavity.

Example 18. The system of example 17, where the second conductive covering surface is a region of the outer wall of the first RF device.

Example 19. The system of one of examples 17 or 18, where the second conductive covering surface is attached to an outer wall of the first RF device, where the second conductive covering surface is opposite the first conductive covering surface.

Example 20. The system of one of examples 17 to 19, where the second conductive covering surface is a region of an outer wall of a second RF device.

Example 21. The system of one of examples 17 to 20, where the first conductive covering surface is attached to a first recess in an outer wall of a first RF device.

Example 22. The system of one of examples 17 to 21, where the second conductive covering surface is attached to a second recess in an outer wall of a second RF device.

Example 23. The system of one of examples 17 to 22, where the RF signal pickup includes: a current pickup; or a voltage pickup; or an electromagnetic (EM) pickup, the EM pickup being a combination of a current pickup and a voltage pickup, the voltage pickup being interposed between the current pickup and the insulating hole.

Example 24. The system of one of examples 17 to 23, where the first conductive covering surface includes a first conductive protrusion disposed around the insulating hole, and the second conductive covering surface includes a second conductive protrusion disposed around the insulating hole, the first conductive protrusion overlaying with the second conductive protrusion.

Example 25. The system of one of examples 17 to 24, where the first conductive covering surface includes a first conductive protrusion disposed around the insulating hole, and the second conductive covering surface includes a second conductive protrusion disposed around the insulating hole, the first conductive protrusion located at a fixed offset distance from the second conductive protrusion.

Example 26. A method of embedding a radio frequency (RF) sensor assembly in an RF system, the method including: having an RF system including: a first RF device having an outer wall; and a second RF device having an outer wall in close proximity to the outer wall of the first RF device, the outer wall of the second RF device being aligned to the first RF device; forming a first recess in a conductive region of the outer wall of the first RF device; embedding a first cover of the RF sensor assembly in the first recess in the outer wall of the first RF device; and covering the first recess after placing the RF sensor assembly in the first recess.

Example 27. The method of example 26, further including: forming a second recess in a conductive region of the outer wall of the second RF device, the second recess being aligned to the first recess; and embedding the second cover of the sensor assembly in the second recess in the outer wall of the second RF device.

Example 28. The method of one of examples 26 or 27, where covering the first recess includes attaching the outer wall of the second RF device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A radio frequency (RF) system comprising:
a first RF device having a first outer wall;
a first conductive covering surface, a portion of the first conductive covering surface comprising a portion of the first outer wall;
a second RF device having a second outer wall, the first RF device being electrically coupled to the second RF device;
a second conductive covering surface, a portion of the second conductive covering surface comprising a portion of the second outer wall;

an insulating hole for an RF center conductor extending through the first conductive covering surface and the second conductive covering surface;

a cavity disposed between the first conductive covering surface and the second conductive covering surface, the cavity being an insulating region; and an RF signal pickup disposed in the cavity.

2. The system of claim 1, wherein the RF signal pickup comprises:

a current pickup, the current pickup having two ends; or a voltage pickup; or an electromagnetic (EM) pickup, the EM pickup being a combination of a current pickup and a voltage pickup, the voltage pickup being interposed between the current pickup and the insulating hole.

3. The system of claim 1, further comprising a conductive region disposed outside the cavity and the insulating hole, and coupling the first conductive covering surface to the second conductive covering surface, wherein the conductive region, the first conductive covering surface, and the second conductive covering surface are coupled to a reference potential.

4. The system of claim 1, further comprising a cavity wall disposed in a peripheral region of the cavity, the cavity being contiguous with the insulating hole and bounded in a radial direction by the cavity wall and an outer surface of the insulating hole.

5. The system of claim 1, wherein a portion of the cavity is a recess in the first outer wall of the first RF device.

6. The system of claim 2, wherein the cavity further comprises electrically insulating components, the electrically insulating components mechanically supporting the RF signal pickup.

7. The system of claim 1, further comprising terminals disposed in a recessed region in the first outer wall, the terminals being coupled to the RF signal pickup, wherein the recessed region further comprises electronic circuitry electrically coupled to the terminals.

8. The system of claim 1, wherein the RF signal pickup is a non-resonant signal pickup for broadband frequencies and harmonics.

9. The system of claim 1, wherein the first RF device is a plasma chamber.

10. A radio frequency (RF) system comprising:

a first conductive covering surface, a portion of the first conductive covering surface comprising a portion of a first outer wall of a first RF device;

a second conductive covering surface aligned to the first conductive covering surface, the second conductive covering surface being disposed around an insulating hole;

the insulating hole for an RF center conductor extending through the first conductive covering surface and the second conductive covering surface, the first conductive covering surface and the second conductive covering surface being disposed around the insulating hole;

a cavity bounded by the first conductive covering surface and the second conductive covering surface, the cavity being an insulating region; and an RF signal pickup disposed within the cavity.

11. The system of claim 10, wherein the second conductive covering surface is a region of the first outer wall of the first RF device.

12. The system of claim 10, wherein the second conductive covering surface is attached to an outer wall of the first RF device, wherein the second conductive covering surface is opposite the first conductive covering surface.

13. The system of claim 10, wherein the second conductive covering surface is a region of an outer wall of a second RF device.

14. The system of claim 10, wherein the first conductive covering surface is attached to a first recess in an outer wall of a first RF device.

15. The system of claim 14, wherein the second conductive covering surface is attached to a second recess in an outer wall of a second RF device.

16. The system of claim 10, wherein the RF signal pickup comprises:

a current pickup; or a voltage pickup; or an electromagnetic (EM) pickup, the EM pickup being a combination of a current pickup and a voltage pickup, the voltage pickup being interposed between the current pickup and the insulating hole.

17. The system of claim 10, wherein the first conductive covering surface comprises a first conductive protrusion disposed around the insulating hole, and the second conductive covering surface comprises a second conductive protrusion disposed around the insulating hole, the first conductive protrusion overlaying with the second conductive protrusion.

18. The system of claim 10, wherein the first conductive covering surface comprises a first conductive protrusion disposed around the insulating hole, and the second conductive covering surface comprises a second conductive protrusion disposed around the insulating hole, the first conductive protrusion located at a fixed offset distance from the second conductive protrusion.

19. A radio frequency (RF) system comprising:

a first conductive covering surface, a portion of the first conductive covering surface comprising a portion of a first outer wall of an impedance matcher circuit;

a second conductive covering surface aligned to the first conductive covering surface, the second conductive covering surface being disposed around an insulating hole, the second conductive covering surface being a region of an outer wall of a plasma chamber;

the insulating hole for an RF center conductor extending through the first conductive covering surface and the second conductive covering surface, the first conductive covering surface and the second conductive covering surface being disposed around the insulating hole;

a cavity bounded by the first conductive covering surface and the second conductive covering surface, the cavity being an insulating region; and an RF signal pickup disposed within the cavity.

20. The system of claim 19, wherein the RF signal pickup comprises:

a current pickup.

21. The system of claim 19, wherein the RF signal pickup comprises a voltage pickup.

22. The system of claim 19, wherein the RF signal pickup comprises an electromagnetic (EM) pickup, the EM pickup being a combination of a current pickup and a voltage pickup, the voltage pickup being interposed between the current pickup and the insulating hole.

* * * * *